United States Patent
Lee et al.

(10) Patent No.: US 11,031,084 B1
(45) Date of Patent: Jun. 8, 2021

(54) MEMORY DEVICE AND METHOD OF OPERATING THE SAME

(71) Applicant: SK hynix Inc., Icheon-si (KR)

(72) Inventors: Jong Hoon Lee, Suwon-si (KR); Se Chun Park, Seoul (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/866,213

(22) Filed: May 4, 2020

(30) Foreign Application Priority Data

Nov. 21, 2019 (KR) .......................... 10-2019-0150464

(51) Int. Cl.
*G11C 16/10* (2006.01)
*G11C 16/34* (2006.01)
*G11C 16/04* (2006.01)
*G11C 11/56* (2006.01)

(52) U.S. Cl.
CPC .......... *G11C 16/10* (2013.01); *G11C 16/0483* (2013.01); *G11C 16/3459* (2013.01); *G11C 11/5628* (2013.01); *G11C 11/5671* (2013.01)

(58) Field of Classification Search
CPC ..................................................... G11C 16/10
USPC .................................................... 365/185.12
See application file for complete search history.

(56) References Cited

U.S. PATENT DOCUMENTS

2017/0242632 A1* 8/2017 Cho ...................... G06F 3/0688

FOREIGN PATENT DOCUMENTS

KR     1020100056860 A     5/2010
KR     1020180091524 A     8/2018

* cited by examiner

*Primary Examiner* — Jason Lappas
(74) *Attorney, Agent, or Firm* — William Park & Associates Ltd.

(57) ABSTRACT

A memory device, in accordance with a method of operation, may include: a plurality of pages coupled to a common word line and configured to be sequentially selected by different select lines; a program operation controller configured to perform a program operation on a first page that is to be programmed first, among the plurality of pages; and a start loop manager configured to generate start loop information about a program loop in which program verification corresponding to each of a plurality of program states to be formed by threshold voltages of memory cells included in the first page starts, during the program operation on the first page. The program operation controller is further configured to perform a program operation on a second page to be programmed subsequent to the first page, among the plurality of pages, based on the start loop information.

20 Claims, 20 Drawing Sheets pass bit check fail bit check

FIG. 11

| PROGRAM STATE | P1 | | P2 | | P3 | | P4 | | ... |
|---|---|---|---|---|---|---|---|---|---|
| CHECK TYPE | pass bit | fail bit | pass bit | fail bit | pass bit | fail bit | pass bit | fail bit | ... |
| START LOOP | 1 | ②  | ②  | ⑤  | ⑤  | ⑨  | ⑨  | ⑭  | ... |
| LAST LOOP | ①  | 5 | ④  | 10 | ⑧  | 14 | ⑬  | ... | ... |

MEMORY DEVICE AND METHOD OF OPERATING THE SAME

CROSS-REFERENCE TO RELATED APPLICATION

The present application claims priority under 35 U.S.C. § 119(a) to Korean patent application number 10-2019-0150464, filed on Nov. 21, 2019, in the Korean Intellectual Property Office, the entire disclosure of which is incorporated herein by reference.

BACKGROUND

1. Technical Field

Various embodiments of the present disclosure generally relate to an electronic device, and more particularly, to a memory device and a method of operating the memory device.

2. Related Art

A storage device is a device which stores data under the control of a host device, such as a computer or a smartphone. The storage device may include a memory device in which data is stored and a memory controller which controls the memory device. Memory devices are classified as volatile memory devices or nonvolatile memory devices.

A volatile memory device is a memory device in which data is stored only when power is supplied and in which stored data is lost when the supply of power is interrupted. Examples of a volatile memory device may include Static Random Access Memory (SRAM) and Dynamic Random Access Memory (DRAM).

A nonvolatile memory device is a memory device in which stored data is retained even when the supply of power is interrupted. Examples of a nonvolatile memory device may include Read Only Memory (ROM), Programmable ROM (PROM), Electrically Programmable ROM (EPROM), Electrically Erasable and Programmable ROM (EEPROM), and flash memory.

SUMMARY

In accordance with an embodiment of the present disclosure, a memory device may include a plurality of pages coupled to a common word line and configured to be sequentially selected by different select lines. The memory device may also include a program operation controller configured to perform a program operation on a first page that is to be programmed first, among the plurality of pages. The memory device may further include a start loop manager configured to generate start loop information about a program loop in which program verification corresponding to each of a plurality of program states to be formed by threshold voltages of memory cells included in the first page starts during the program operation on the first page. The program operation controller may be configured to perform a program operation on a second page to be programmed subsequent to the first page, among the plurality of pages, based on the start loop information.

In accordance with an embodiment of the present disclosure, a memory device may include a first cell string and a second cell string coupled to a common bit line. The memory device may also include a program operation controller configured to sequentially program a first memory cell coupled to a common word line, among memory cells included in the first cell string, and a second memory cell coupled to the common word line, among memory cells included in the second cell string. The memory device may further include a start loop manager configured to generate start loop information about a program loop in which program verification, corresponding to each of a plurality of program states that are capable of being formed by a threshold voltage of the first memory cell, starts during a program operation on the first memory cell. A program operation on the second memory cell is performed based on the start loop information.

In accordance with an embodiment of the present disclosure, a method of operating a memory device, wherein the memory device includes a plurality of pages coupled to a common word line and configured to be sequentially selected by different select lines, the pages each having a plurality of memory cells, may include, during a program operation on a first page to be programmed first, among the plurality of pages, generating start loop information about a program loop in which program verification for pages to be subsequently programmed starts, based on a program loop in which program verification for each of a plurality of program states has passed. The method may also include programming a second page to be programmed subsequent to the first page, among the plurality of pages, based on the start loop information.

BRIEF DESCRIPTION OF THE DRAWINGS

FIG. 11 is a diagram illustrating a check operation performed during a program operation on a first page.

DETAILED DESCRIPTION

Specific structural or functional descriptions in the embodiments of the present disclosure introduced in this specification or application are exemplified to describe embodiments according to the concept of the present disclosure. The embodiments according to the concept of the present disclosure may be practiced in various forms, and should not be construed as being limited to the embodiments described in the specification or application.

Various embodiments of the present disclosure will now be described more fully hereinafter with reference to the accompanying drawings, in which preferred embodiments of the present disclosure are shown, so that those skilled in the art can easily practice the technical spirit of the present disclosure.

Various embodiments of the present disclosure are directed to a memory device having a shortened program operation time and a method of operating the memory device.

Figure 1:
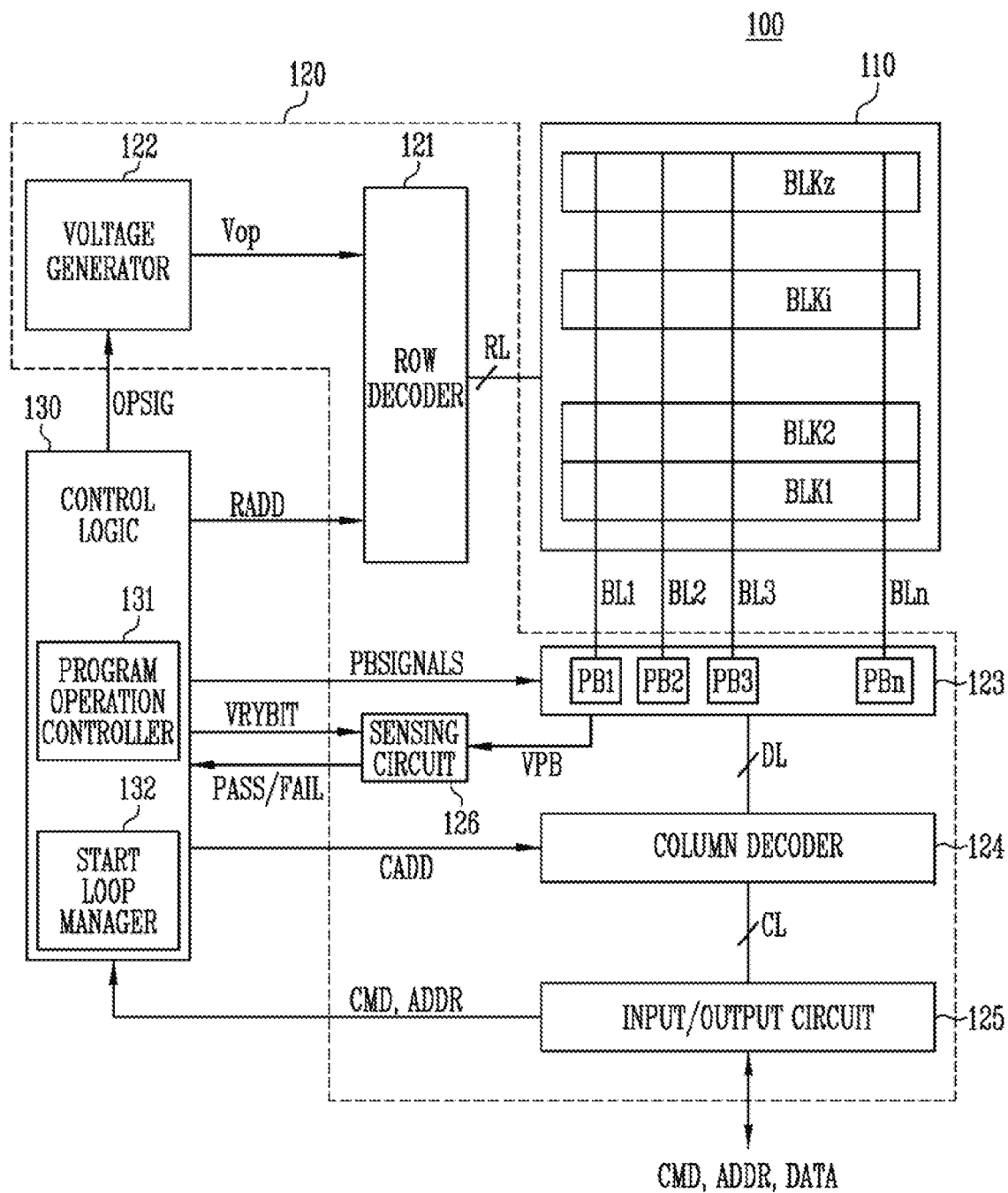
FIG. 1 is a diagram illustrating a memory device.

FIG. 1 is a diagram illustrating a memory device 100.

Referring to FIG. 1, the memory device 100 may include a memory cell array 110, a peripheral circuit 120, and control logic 130.

The memory cell array 110 includes a plurality of memory blocks BLK1 to BLKz. The plurality of memory blocks BLK1 to BLKz are coupled to a row decoder 121 through row lines RL. Each of the memory blocks BLK1 to BLKz may be coupled to a page buffer group 123 through bit lines BL1 to BLn. Each of the memory blocks BLK1 to BLKz includes a plurality of memory cells. In an embodiment, the plurality of memory cells may be nonvolatile memory cells. Memory cells coupled to each word line may be defined as a page. Therefore, a single memory block may include a plurality of pages.

In an embodiment, a single word line may be coupled to a plurality of pages. For example, first to fourth pages may be coupled to a single word line. The plurality of pages coupled to the single word line may be selectively programmed, read, or erased by selecting a source select line. Because the plurality of pages are coupled to the same word line, they may have similar characteristics. Therefore, start loop information acquired through a program operation performed on a single page selected from among the plurality of pages may be used for a program operation on another page. The start loop information may include information about verify voltages to be applied during a program verify period. Alternatively, the start loop information may include information about a program loop in which program verification for each of a plurality of program states starts.

The row lines RL may include at least one source select line, a plurality of word lines, and at least one drain select line.

Each of the memory cells included in the memory cell array 110 may be implemented as a single-level cell (SLC) capable of storing one data bit, a multi-level cell (MLC) capable of storing two data bits, a triple-level cell (TLC) capable of storing three data bits, or a quad-level cell (QLC) capable of storing four data bits.

The peripheral circuit 120 may perform a program operation, a read operation, or an erase operation on a selected area of the memory cell array 110 under the control of the control logic 130. The peripheral circuit 120 may drive the memory cell array 110. For example, the peripheral circuit 120 may apply various operating voltages to the row lines RL and the bit lines BL1 to BLn or discharge the applied voltages under the control of the control logic 130.

The peripheral circuit 120 may include the row decoder 121, a voltage generator 122, the page buffer group 123, a column decoder 124, an input/output circuit 125, and a sensing circuit 126.

The row decoder 121 is coupled to the memory cell array 110 through the row lines RL. The row lines RL may include the at least one source select line, the plurality of word lines, and the at least one drain select line. In an embodiment, the word lines may include normal word lines and dummy word lines. In an embodiment, the row lines RL may further include a pipe select line.

The row decoder 121 may be operated under the control of the control logic 130. The row decoder 121 may receive a row address RADD from the control logic 130.

The row decoder 121 may decode the row address RADD received from the control logic 130. The row decoder 121 selects at least one of the memory blocks BLK1 to BLKz according to the decoded address. Further, the row decoder 121 may select at least one word line WL of the selected memory block so that voltages generated by the voltage generator 122 are applied to the at least one word line WL according to the decoded address.

For example, during a program operation, the row decoder 121 may apply a program voltage to a selected word line and apply a program pass voltage having a level lower than that of the program voltage to unselected word lines. During program verification, the row decoder 121 may apply a verify voltage to a selected word line and apply a verify pass voltage higher than the verify voltage to unselected word lines. During a read operation, the row decoder 121 may apply a read voltage to a selected word line and apply a read pass voltage higher than the read voltage to unselected word lines.

In an embodiment, the erase operation of the memory cell array 110 is performed on a memory block basis. During an erase operation, the row decoder 121 may select one memory block according to the decoded address. During the erase operation, the row decoder 121 may apply a ground voltage to word lines coupled to the selected memory block.

The voltage generator 122 may be operated under the control of the control logic 130. The voltage generator 122 may generate a plurality of voltages using an external supply voltage provided to the memory device. In detail, the voltage generator 122 may generate various operating voltages Vop that are used for program, read, and erase operations in response to an operation signal OPSIG. For example, the voltage generator 122 may generate a program voltage, a verify voltage, a pass voltages, a read voltage, an erase voltage, etc. under the control of the control logic 130.

In an embodiment, the voltage generator 122 may generate an internal supply voltage by regulating the external supply voltage. The internal supply voltage generated by the voltage generator 122 is used as an operating voltage for the memory cell array 110.

In an embodiment, the voltage generator 122 may generate a plurality of voltages using the external supply voltage or the internal supply voltage.

For example, the voltage generator 122 may include a plurality of pumping capacitors for receiving the internal supply voltage and generate a plurality of voltages by selectively enabling the plurality of pumping capacitors under the control of the control logic 130.

The generated voltages may be supplied to the memory cell array 110 by the row decoder 121.

The page buffer group 123 includes first to n-th page buffers PB1 to PBn. The first to n-th page buffers PB1 to PBn are coupled to the memory cell array 110 through the first to n-th bit lines BL1 to BLn. The first to n-th page buffers PB1 to PBn are operated under the control of the control logic 130. In detail, the first to n-th page buffers PB1 to PBn may be operated in response to page buffer control signals PBSIGNALS. For example, the first to n-th page buffers PB1 to PBn may temporarily store data received through the first to n-th bit lines BL1 to BLn or may sense voltages or currents of the bit lines BL1 to BLn during a read operation or program verification.

In an embodiment, during a sensing period for program verification, voltages or currents of bit lines BL1 to BLn may be sensed, and the sensed voltages or currents may be stored in the page buffers PB1 to PBn.

In detail, during a program operation, when a program pulse is applied to a selected word line, the first to n-th page buffers PB1 to PBn may transfer data DATA, received through the input/output circuit 125, to selected memory cells through the first to n-th bit lines BL1 to BLn. The memory cells in the selected page are programmed based on the received data DATA. Memory cells coupled to a bit line to which a program permission voltage (e.g., a ground voltage) is applied may have increased threshold voltages. The threshold voltages of memory cells coupled to a bit line to which a program inhibit voltage (for example, a supply voltage) is applied may be maintained. During a program verify operation, the first to n-th page buffers PB1 to PBn may read page data from the selected memory cells through the first to n-th bit lines BL1 to BLn.

During a read operation, the first to n-th page buffers PB1 to PBn may read data DATA from the memory cells in the selected page through the first to n-th bit lines BL1 to BLn, and may output the read data DATA to the input/output circuit 125 under the control of the column decoder 124.

During the erase operation, the first to n-th page buffers PB1 to PBn may allow the first to n-th bit lines BL1 to BLn to float.

The column decoder 124 may transfer data between the input/output circuit 125 and the page buffer group 123 in response to a column address CADD. For example, the column decoder 124 may exchange data with the first to n-th page buffers PB1 to PBn through data lines DL or may exchange data with the input/output circuit 125 through column lines CL.

The input/output circuit 125 may transfer a command CMD and an address ADDR, received from the memory controller 200, to the control logic 130, or may exchange the data DATA with the column decoder 124.

During a read operation or a program verify operation, the sensing circuit 126 may generate a reference current in response to an enable bit VRYBIT, and may compare a sensing voltage VPB received from the page buffer group 123 with a reference voltage generated using the reference current and then output a pass signal PASS or a fail signal FAIL.

In an embodiment, the sensing circuit 126 may output the pass signal PASS or the fail signal FAIL during a check period for program verification.

The sensing circuit 126 may compare the sensing voltage VPB received from the page buffer group 123 with the reference voltage generated using the reference current, and then output the pass signal PASS or the fail signal FAIL depending on whether the number of memory cells having threshold voltages higher than a verify voltage is greater than a first reference number. That is, the sensing circuit 126 may check a pass bit.

The sensing circuit 126 may compare the sensing voltage VPB received from the page buffer group 123 with the reference voltage generated using the reference current, and then output the pass signal PASS or the fail signal FAIL depending on whether the number of memory cells having threshold voltages lower than the verify voltage is less than a second reference number. That is, the sensing circuit 126 may check a fail bit.

The control logic 130 may control the peripheral circuit 120 by outputting the operation signal OPSIG, the row address RADD, the page buffer control signals PBSIGNALS, and the enable bit VRYBIT in response to the command CMD and the address ADDR. In addition, the control logic 130 may determine whether program verification has passed or failed in response to the pass or fail signal PASS or FAIL. The control logic 130 may be implemented as hardware, software, or a combination of hardware and software. For example, the control logic 130 may be a control logic circuit operating in accordance with an algorithm and/or a processor executing control logic code.

A program operation controller 131 may receive a program command and an address from the memory controller 200, and may perform a program operation of programming data to an area of the memory cell array indicated by the address.

The program operation controller 131 may perform a program operation on a second page based on start loop information acquired from a program operation on a first page. In detail, the program operation controller 131 may selectively apply verify voltages to a selected word line in each program loop during the program operation on the second page, based on information about a program loop in which program verification for each of a plurality of program states included in the start loop information starts. In other words, the program operation controller 131 may perform a blind program operation by applying verify voltages in such a way as to omit verify voltages determined based on the start loop information, rather than applying all of first to seventh verify voltages in each program loop.

A start loop manager 132 may receive a pass/fail signal from the sensing circuit 126, and may generate start loop information based on a program loop in which program verification has passed.

A detailed method of generating the start loop information will be described later with reference to FIGS. 10 to 17.

Figure 2:
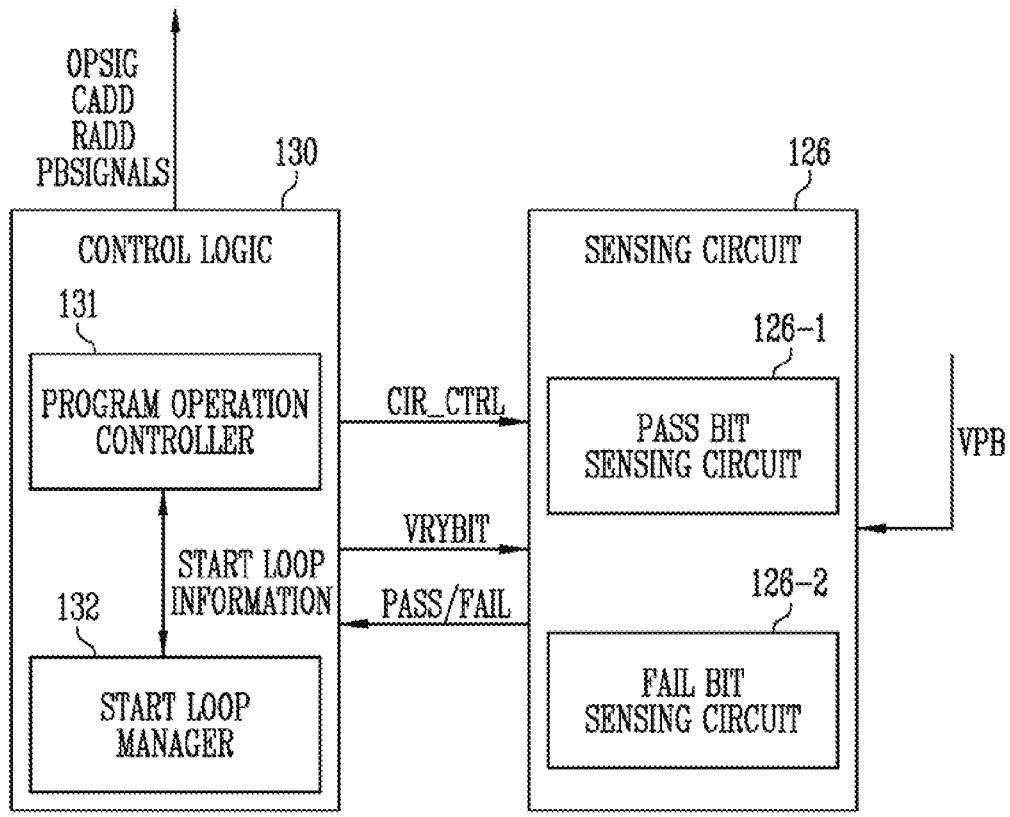
FIG. 2 is a diagram illustrating a memory device 100 according to an embodiment.

FIG. 2 is a diagram illustrating the memory device 100 according to an embodiment.

Referring to FIG. 2, the control logic 130 may include a program operation controller 131 and a start loop manager 132. The program operation controller 131 may sequentially perform a program operation on a plurality of pages. The program operation controller 131 may perform a program operation on a second page to be programmed subsequent to a first page that is programmed first, based on start loop information acquired during a program operation performed on the first page.

In detail, the program operation controller 131 may transfer a sensing circuit control signal CIR_CTRL to the sensing circuit 126 so that, after a pass bit check operation for each of a plurality of program states has passed during the program operation on the first page, a fail bit check operation is performed. In detail, when, for each of the plurality of program states, a pass signal is received from a pass bit sensing circuit 126-1, the program operation controller 131 may transfer the sensing circuit control signal CIR_CTRL to the sensing circuit 126 so that a fail bit sensing circuit 126-2 is operated.

The start loop manager 132 may generate the start loop information based on the program loop in which the pass signal is received from the pass bit sensing circuit 126-1. The start loop information may include information about verify voltages to be applied during a program verify period of each program loop. Alternatively, the start loop information may include information about a program loop in which a fail bit check operation for each of a plurality of program states starts.

The sensing circuit 126 may include the pass bit sensing circuit 126-1 and the fail bit sensing circuit 126-2. The control logic 130 may include the program operation controller 131 and the start loop manager 132.

The pass bit sensing circuit 126-1 may compare a sensing voltage VPB received from the page buffer group 123 with a reference voltage generated using a reference current, and then output a pass signal PASS or a fail signal FAIL depending on whether the number of memory cells having threshold voltages higher than a verify voltage is greater than a first reference number. That is, the sensing circuit 126 may check a pass bit.

The fail bit sensing circuit 126-2 may compare the sensing voltage VPB received from the page buffer group 123 with the reference voltage generated using the reference current, and then output the pass signal PASS or the fail signal FAIL depending on whether the number of memory cells having threshold voltages lower than the verify voltage is less than a second reference number. That is, the sensing circuit 126 may check a fail bit.

The sensing circuit 126 may receive the sensing circuit control signal CIR_CTRL from the control logic 130. Any one of the pass bit sensing circuit 126-1 and the fail bit sensing circuit 126-2 may receive the sensing voltage VPB in response to the sensing circuit control signal CIR_CTRL, and may output the pass signal PASS or the fail signal FAIL.

The program operation controller 131 may reduce the number of program verify operations based on the start loop information during the program operation on the second page. In detail, the program operation controller 131 may shorten the time required for a program operation (program operation time) by controlling the peripheral circuit 120 so that a fail bit check operation is performed from a program loop determined based on the start loop information.

Figure 3:
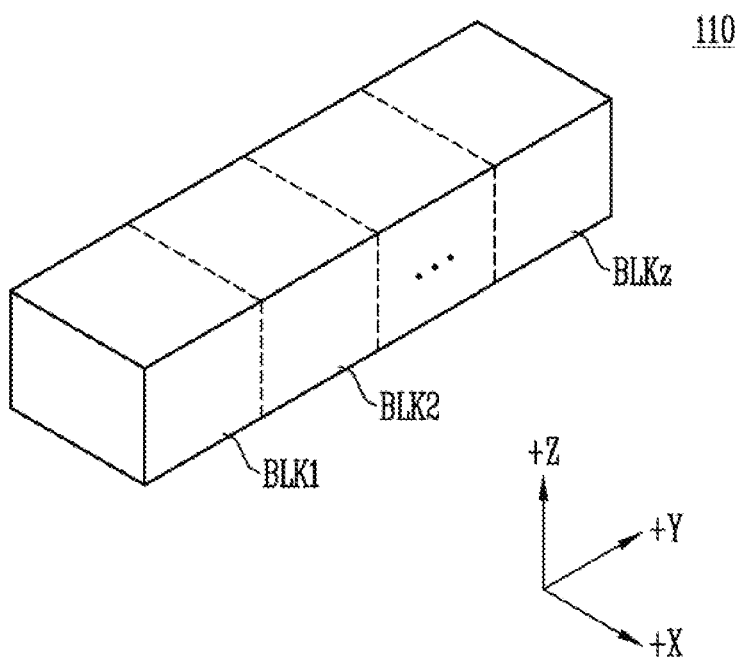
FIG. 3 is a diagram illustrating an embodiment of a memory cell array of FIG. 1.

FIG. 3 is a diagram illustrating an embodiment of the memory cell array 110 of FIG. 1.

Referring to FIG. 3, the memory cell array 110 includes a plurality of memory blocks BLK1 to BLKz. Each memory block may have a three-dimensional (3D) structure. Each memory block includes a plurality of memory cells stacked on a substrate. Such memory cells are arranged in a positive X (+X) direction, a positive Y (+Y) direction, and a positive Z (+Z) direction. The structure of each memory block will be described in detail below with reference to FIGS. 4 and 5.

Figure 4:
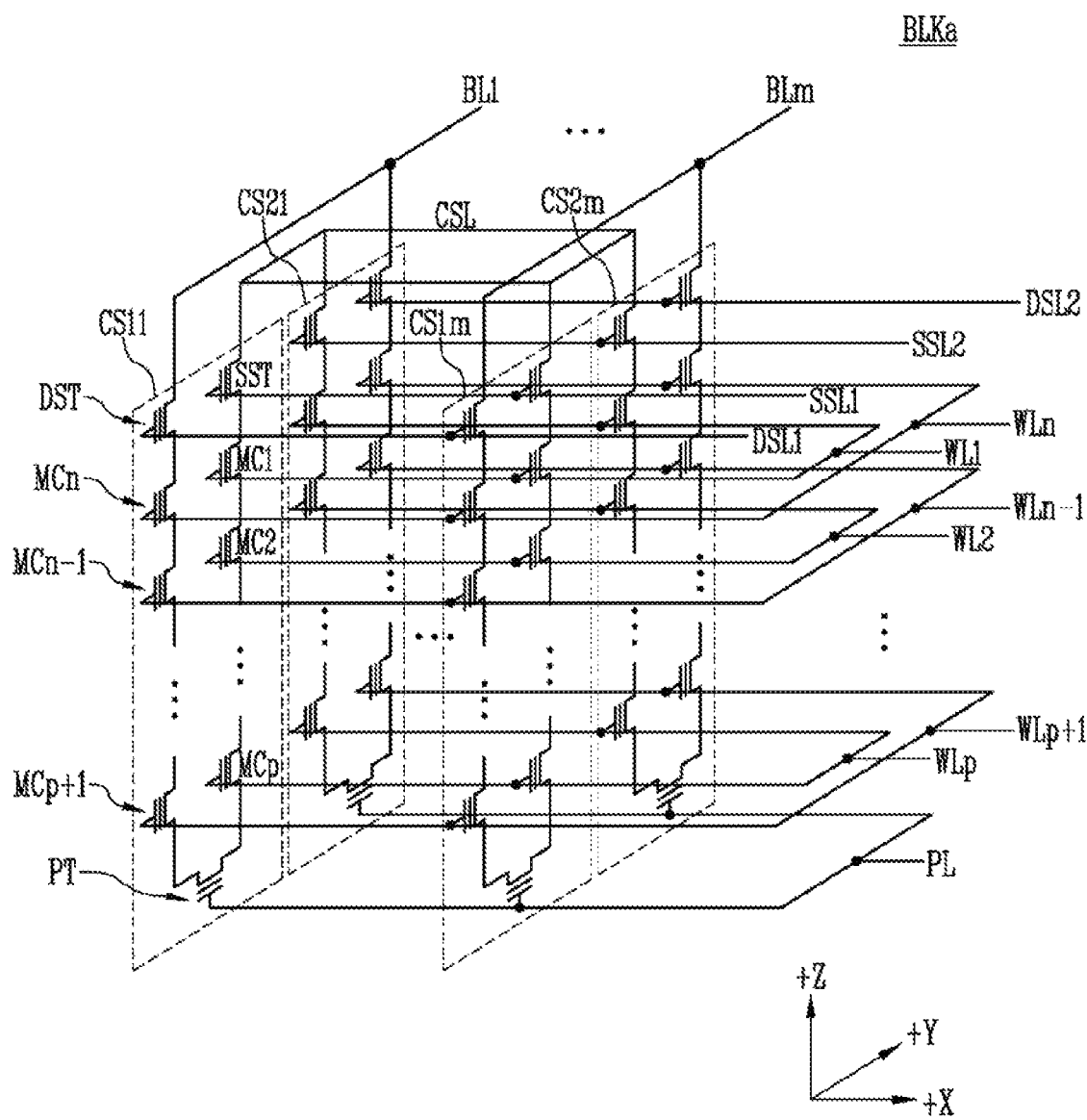
FIG. 4 is a circuit diagram illustrating a memory block BLKa of memory blocks BLK1 to BLKz of FIG. 3.

FIG. 4 is a circuit diagram illustrating any one memory block BLKa of memory blocks BLK1 to BLKz of FIG. 3.

Referring to FIG. 4, the memory block BLKa includes a plurality of cell strings CS11 to CS1$m$ and CS21 to CS2$m$. In an embodiment, each of the cell strings CS11 to CS1$m$ and CS21 to CS2$m$ may be formed in a 'U' shape. In the memory block BLKa, m cell strings are arranged in a row direction (i.e. a positive (+) X direction). In FIG. 4, two cell strings are illustrated as being arranged in a column direction (i.e. a positive (+) Y direction). However, this illustration is made for convenience of description, and it will be understood that three or more cell strings may be arranged in the column direction.

Each of the plurality of cell strings CS11 to CS1$m$ and CS21 to CS2$m$ includes at least one source select transistor SST, first to n-th memory cells MC1 to MCn, a pipe transistor PT, and at least one drain select transistor DST.

The select transistors SST and DST and the memory cells MC1 to MCn may have similar structures. In an embodiment, each of the select transistors SST and DST and the memory cells MC1 to MCn may include a channel layer, a tunneling insulating layer, a charge storage layer, and a blocking insulating layer. In an embodiment, a pillar for providing the channel layer may be provided in each cell string. In an embodiment, a pillar for providing at least one of the channel layer, the tunneling insulating layer, the charge storage layer, and the blocking insulating layer may be provided in each cell string.

The source select transistor SST of each cell string is connected between the common source line CSL and memory cells MC1 to MCp.

In an embodiment, the source select transistors of cell strings arranged in the same row are coupled to a source select line extending in a row direction, and source select transistors of cell strings arranged in different rows are coupled to different source select lines. In FIG. 4, source select transistors of cell strings CS11 to CS1$m$ in a first row are coupled to a first source select line SSL1. The source select transistors of cell strings CS21 to CS2$m$ in a second row are coupled to a second source select line SSL2.

In an embodiment, source select transistors of the cell strings CS11 to CS1$m$ and CS21 to CS2$m$ may be coupled in common to a single source select line.

The first to n-th memory cells MC1 to MCn in each cell string are coupled between the source select transistor SST and the drain select transistor DST.

The first to n-th memory cells MC1 to MCn may be divided into first to p-th memory cells MC1 to MCp and p+1-th to n-th memory cells MCp+1 to MCn. The first to p-th memory cells MC1 to MCp are sequentially arranged in a direction opposite a positive (+) Z direction and are connected in series between the source select transistor SST and the pipe transistor PT. The p+1-th to n-th memory cells MCp+1 to MCn are sequentially arranged in the +Z direction and are connected in series between the pipe transistor PT and the drain select transistor DST. The first to p-th memory cells MC1 to MCp and the p+1-th to n-th memory cells MCp+1 to MCn are coupled to each other through the pipe transistor PT. The gates of the first to n-th memory cells MC1 to MCn of each cell string are coupled to first to n-th word lines WL1 to WLn, respectively.

A gate of the pipe transistor PT of each cell string is coupled to a pipeline PL.

The drain select transistor DST of each cell string is connected between the corresponding bit line and the memory cells MCp+1 to MCn. The cell strings in a row direction are coupled to drain select lines extending in a row direction. Drain select transistors of cell strings CS11 to CS1m in the first row are coupled to a first drain select line DSL1. Drain select transistors of cell strings CS21 to CS2m in a second row are coupled to a second drain select line DSL2.

Cell strings arranged in a column direction are coupled to bit lines extending in a column direction. In FIG. 4, cell strings CS11 and CS21 in a first column are coupled to a first bit line BL1. Cell strings CS1m and CS2m in an m-th column are coupled to an m-th bit line BLm.

Memory cells coupled to the same word line in cell strings arranged in the row direction form a single page. For example, memory cells coupled to the first word line WL1, among the cell strings CS11 to CS1m in the first row, form a single page. Memory cells coupled to the first word line WL1, among the cell strings CS21 to CS2m in the second row, form an additional page. That is, a plurality of pages may be coupled to a single word line.

Cell strings arranged in the direction of a single row may be selected by selecting any one of the drain select lines DSL1 and DSL2. The program operation controller 131 may select any one of the drain select lines by applying a select voltage to the drain select lines. That is, the select voltage may be applied to the selected drain select line, and an unselect voltage may be applied to an unselected drain select line. A single page may be selected from the selected cell strings by selecting any one of the word lines WL1 to WLn. That is, because any one of the drain select lines is selected, any one page may be selected from among the plurality of pages coupled to a single word line.

Portions of the corresponding word line coupled to respective pages may be sub-word lines. For example, a word line coupled to the gates of the n-th memory cells MCn included in the cell strings CS11 to CS1m in the first row may be a first sub-word line. For example, a word line coupled to the gates of the n-th memory cells MCn included in the cell strings CS21 to CS2m in the second row may be a second sub-word line.

The sub-word lines may be coupled to a common word line. For example, the n-th word line WLn may be a command word line of the first sub-word line and the second sub-word line.

Although, for convenience of description, it is described that any one of a plurality of pages is selected by applying a select voltage to the corresponding drain select line, it is also possible to select any one of a plurality of pages by applying the select voltage to the corresponding source select line.

In an embodiment, instead of the first to m-th bit lines BL1 to BLm, even bit lines and odd bit lines may be provided. Further, even-numbered cell strings, among the cell strings CS11 to CS1m or CS21 to CS2m arranged in the row direction, may be coupled to respective even bit lines. Odd-numbered cell strings, among the cell strings CS11 to CS1m or CS21 to CS2m arranged in the row direction, may be coupled to respective odd bit lines.

The program operation controller 131 may sequentially perform a program operation on a plurality of pages coupled to a single word line. For example, the program operation controller 131 may sequentially perform a program operation on two pages coupled to the first word line WL1.

In an embodiment, the start loop manager 132 may generate start loop information when a program operation is performed on a first page, which is an initial page among the plurality of pages to be sequentially programmed.

The program operation controller 131 may perform a program operation on a second page, which is a subsequent page to be programmed after the first page, based on the start loop information generated during the program operation performed on the first page. The program operation controller 131 may perform a blind program operation on the second page based on the start loop information. The blind program operation may be a program operation of omitting program verification in a program loop to be performed prior to the program loop determined based on the start loop information.

In an embodiment, one or more of the first to n-th memory cells MC1 to MCn may be used as dummy memory cells. For example, one or more dummy memory cells are provided to reduce an electric field between the source select transistor SST and the memory cells MC1 to MCp. Alternatively, the one or more dummy memory cells are provided to reduce an electric field between the drain select transistor DST and the memory cells MCp+1 to MCn. As more dummy memory cells are provided, the reliability of the operation of the memory block BLKa is improved, but the size of the memory block BLKa is increased. As fewer memory cells are provided, the size of the memory block BLKa is reduced, but the reliability of the operation of the memory block BLKa may be deteriorated.

In order to efficiently control the one or more dummy memory cells, each of the dummy memory cells may have a required threshold voltage. Before or after the erase operation of the memory block BLKa is performed, a program operation may be performed on all or some of the dummy memory cells. When an erase operation is performed after the program operation has been performed, the threshold voltages of the dummy memory cells control the voltages that are applied to the dummy word lines coupled to respective dummy memory cells, and thus the dummy memory cells may have required threshold voltages.

Figure 5:
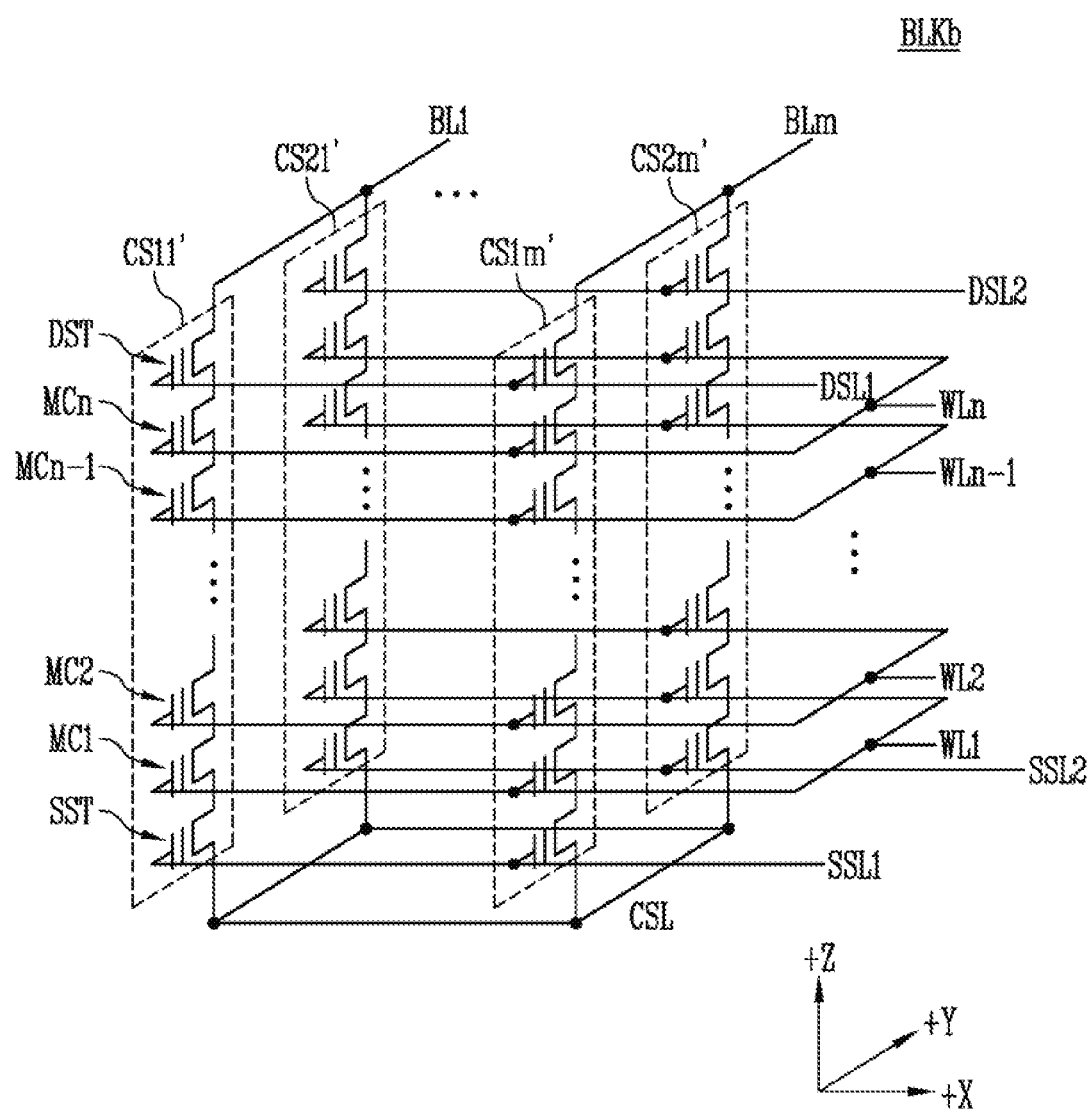
FIG. 5 is a circuit diagram illustrating an example of a memory block BLKb of the memory blocks BLK1 to BLKz of FIG. 3.

FIG. 5 is a circuit diagram illustrating an example of any one memory block BLKb of the memory blocks BLK1 to BLKz of FIG. 3.

Referring to FIG. 5, the memory block BLKb includes a plurality of cell strings CS11' to CS1m' and CS21' to CS2m'. Each of the plurality of cell strings CS11' to CS1m' and CS21' to CS2m' extends in a positive Z (+Z) direction. Each of the cell strings CS11' to CS1m' and CS21' to CS2m' includes at least one source select transistor SST, first to n-th memory cells MC1 to MCn, and at least one drain select transistor DST, which are stacked on a substrate (not illustrated) below the memory block BLKb.

The source select transistor SST of each cell string is connected between a common source line CSL and memory cells MC1 to MCn. The source select transistors of cell strings arranged in the same row are coupled to the same source select line. Source select transistors of cell strings CS11' to CS1m' arranged in a first row are coupled to a first source select line SSL1. Source select transistors of cell strings CS21' to CS2m' arranged in a second row are coupled to a second source select line SSL2. In an embodiment, source select transistors of the cell strings CS11' to CS1m' and CS21' to CS2m' may be coupled in common to a single source select line.

The first to n-th memory cells MC1 to MCn in each cell string are connected in series between the source select transistor SST and the drain select transistor DST. The gates of the first to n-th memory cells MC1 to MCn are coupled to first to n-th word lines WL1 to WLn, respectively.

The drain select transistor DST of each cell string is connected between the corresponding bit line and the memory cells MC1 to MCn. Drain select transistors of cell strings arranged in a row direction are coupled to drain select lines extending in a row direction. The drain select transistors of the cell strings CS11' to CS1m' in the first row are coupled to a first drain select line DSL1. The drain select transistors of the cell strings CS21' to CS2m' in the second row are coupled to a second drain select line DSL2.

As a result, the memory block BLKb of FIG. 5 has an equivalent circuit similar to that of the memory block BLKa of FIG. 4 except that a pipe transistor PT is excluded from each cell string.

Therefore, memory cells included in the memory block BLKb may form a plurality of pages coupled to a single word line.

Portions of the corresponding word line coupled to respective pages may be sub-word lines. For example, a word line coupled to the gates of n-th memory cells MCn included in cell strings CS11' to CS1m' in the first row may be a first sub-word line. For example, a word line coupled to the gates of n-th memory cells MCn included in cell strings CS21' to CS2m' in the second row may be a second sub-word line.

The sub-word lines may be coupled to a common word line. For example, the n-th word line WLn may be a command word line of the first sub-word line and the second sub-word line.

The program operation controller 131 may sequentially perform a program operation on a plurality of pages coupled to a single word line. For example, the program operation controller 131 may sequentially perform a program operation on two pages coupled to the first word line WL1.

In an embodiment, the start loop manager 132 may generate start loop information when a program operation is performed on a first page, which is an initial page among the plurality of pages to be sequentially programmed.

The program operation controller 131 may perform a program operation on a second page, which is a subsequent page to be programmed after the first page, based on the start loop information generated during the program operation performed on the first page. The program operation controller 131 may perform a blind program operation on the second page based on the start loop information. The blind program operation may be a program operation of omitting program verification in a program loop to be performed prior to the program loop determined based on the start loop information.

In an embodiment, instead of the first to m-th bit lines BL1 to BLm, even bit lines and odd bit lines may be provided. Further, even-numbered cell strings, among the cell strings CS11' to CS1m' or CS21' to CS2m' arranged in the row direction, may be coupled to respective even bit lines. Odd-numbered cell strings, among the cell strings CS11' to CS1m' or CS21' to CS2m' arranged in the row direction, may be coupled to respective odd bit lines.

In an embodiment, one or more of the first to n-th memory cells MC1 to MCn may be used as dummy memory cells. For example, the one or more dummy memory cells are provided to reduce an electric field between the source select transistor SST and the memory cells MC1 to MCn. Alternatively, the one or more dummy memory cells are provided to reduce an electric field between the drain select transistor DST and the memory cells MC1 to MCn. As the number of dummy memory cells that are provided increases, the reliability of operation of the memory block BLKb may be improved, whereas the size of the memory block BLKb may increase. As the number of dummy memory cells that are provided decreases, the size of the memory block BLKb may decrease, whereas the reliability of operation of the memory block BLKb may be deteriorated.

In order to efficiently control the one or more dummy memory cells, respective dummy memory cells may have required threshold voltages. Before or after an erase operation on the memory block BLKb is performed, program operations may be performed on all or some of the dummy memory cells. When the erase operation is performed after the program operations have been performed, the dummy memory cells may have required threshold voltages by controlling voltages to be applied to dummy word lines coupled to respective dummy memory cells.

Figure 6:
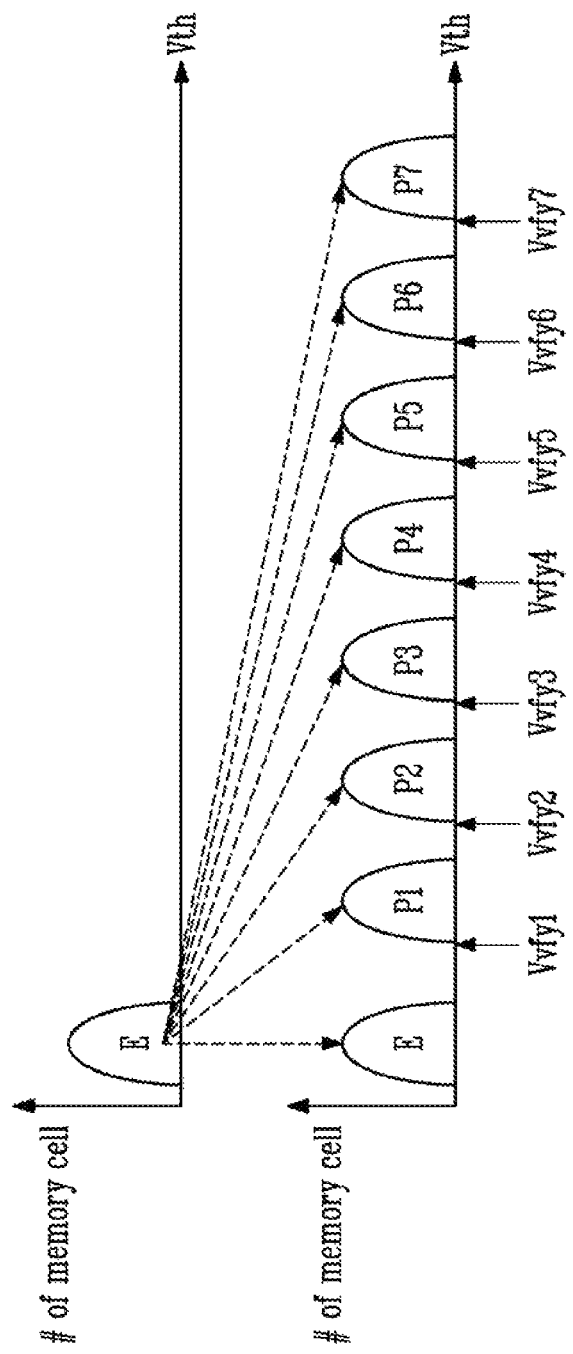
FIG. 6 is a diagram for explaining program states of memory cells.

FIG. 6 is a diagram for explaining program states of memory cells.

Referring to FIG. 6, each memory cell may be programmed to an erased state E or one of seven program states P1 to P7 depending on the threshold voltage of the memory cell. Although, for convenience of description, the memory cell is illustrated as being a triple-level cell (TLC) that can be programmed to any one of one erased state and seven program states, the embodiment is not limited thereto. For example, the memory cell may be a multi-level cell (MLC), a single-level cell (SLC), a quad-level cell (QLC), etc. For convenience of description, although the erased state is separated from the program states, the erased state may be represented by a 0-th program state P0. Therefore, the erased state E and the seven program states P1 to P7 may be represented by program states.

Each of the memory cells coupled to the selected word line may have a threshold voltage included in the erased state E or any one of seven program states P1 to P7. That is, each of the memory cells may be programmed to have a threshold voltage included in the erased state E or any one of the seven program states P1 to P7. Before the program operation is performed, each memory cell may be in the erased state E. During a program operation, the memory cell in the erased state E may be programmed to any one of seven program states when a program voltage is applied to a selected word line.

The erased state E and the seven program states P1 to P7 may be distinguished from each other using verify voltages. For example, the erased state E and the first program state P1 may be distinguished from each other using a first verify voltage Vvf1. The first program state P1 and the second program state P2 may be distinguished from each other using a second verify voltage Vvf2. The second program state P2 and the third program state P3 may be distinguished from each other using a third verify voltage Vvf3. The third program state P3 and the fourth program state P4 may be distinguished from each other using a fourth verify voltage Vvf4. The fourth program state P4 and the fifth program state P5 may be distinguished from each other using a fifth verify voltage Vvf5. The fifth program state P5 and the sixth program state P6 may be distinguished from each other using a sixth verify voltage Vvf6. The sixth program state P6 and the seventh program state P7 may be distinguished from each other using a seventh verify voltage Vvf7.

A program method illustrated in FIG. 6 may form seven program states P1 to P7 and one erased state E. The program states illustrated in FIG. 6 may be formed while a program operation including first to N-th program loops illustrated in FIG. 7 is performed once.

Figure 7:
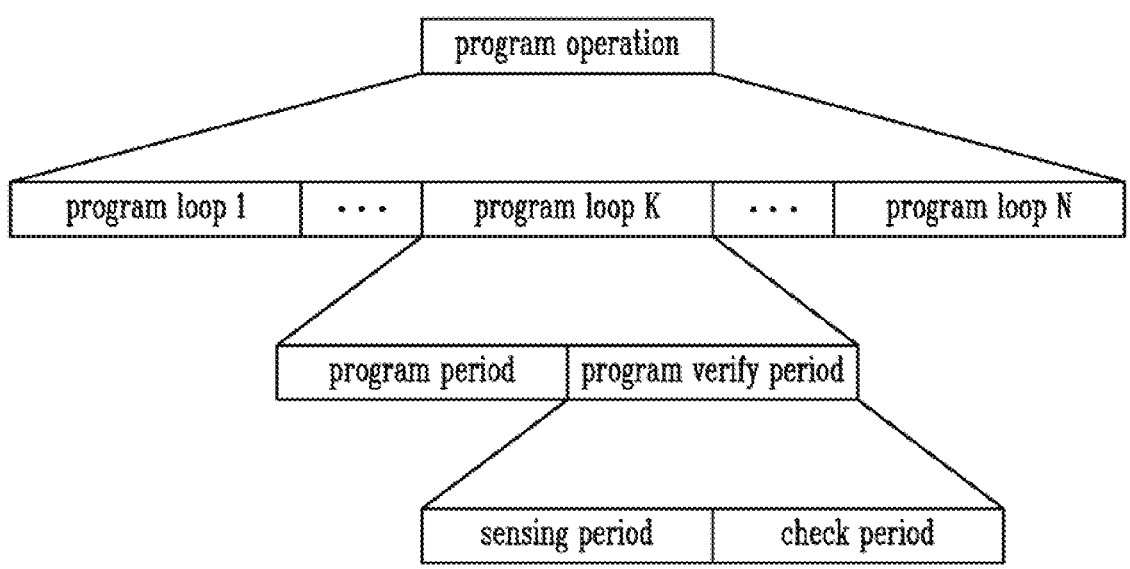
FIG. 7 is a diagram illustrating a program operation.

FIG. 7 is a diagram illustrating a program operation.

Referring to FIG. 7, the program operation may include a plurality of program loops. For example, the program operation may include a first program loop (program loop 1) to an N-th program loop (program loop N). A plurality of memory cells included in a selected page may be programmed to a plurality of program states through the program operation. The plurality of program states may be divided based on threshold voltages. For example, when each of memory cells included in the selected page is operated as a single-level cell (SLC), the plurality of program states may be divided into an erased state and a program state. When each of the memory cells included in the selected page is operated as a multi-level cell (MLC), the plurality of program states may be divided into one erased state and three program states.

The program loop may include a program period and a program verify period.

The program period may be a period during which data is programmed to a selected page. The program period may include a precharge period, a program voltage apply period, and a discharge period. During the precharge period, a program permission voltage is precharged in a selected bit line, and a program inhibit voltage may be precharged in an unselected bit line. During the program voltage apply period, a program voltage may be applied to a selected word line, and a pass voltage may be applied to an unselected word line. During the discharge period, the voltages precharged in the bit lines and the voltages applied to the word lines may be discharged.

The program verify period may be a period during which programmed data is verified. The program verify period may include a sensing period and a check period.

The sensing period may include a precharge period, an evaluation period, and a discharge period. During the precharge period, the bit lines may be precharged. During the evaluation period, a verify voltage may be applied to a selected word line, and a pass voltage may be applied to an unselected word line. During the evaluation period, the voltage that is precharged in a bit line coupled to a memory cell having a threshold voltage higher than the verify voltage may be maintained. During the evaluation period, the voltage that is precharged in a bit line coupled to a memory cell having a threshold voltage lower than the verify voltage may be discharged in proportion to the length of the evaluation period. Voltage information indicating whether the precharged voltage has been maintained or discharged may be stored in the page buffer group 123.

The check period may be a period during which it is determined whether program verification has passed or failed using the voltage information stored in the page buffer group 123. During the check period, the sensing circuit 126 may determine whether the number of memory cells having threshold voltages higher than the verify voltage, among a plurality of memory cells included in the corresponding page, is greater than a first reference number, and may output a pass signal or a fail signal. Determination of whether the number of memory cells having threshold voltages higher than the verify voltage, among the plurality of memory cells included in the corresponding page, is greater than the first reference number may be a pass bit check operation. During the check period, the sensing circuit 126 may determine whether the number of memory cells having threshold voltages lower than the verify voltage, among the plurality of memory cells included in the corresponding page, is less than a second reference number, and may output a pass signal or a fail signal. Determination of whether the number of memory cells having threshold voltages lower than the verify voltage, among the plurality of memory cells included in the corresponding page, is less than the second reference number, may be a fail bit check operation.

Figure 8:
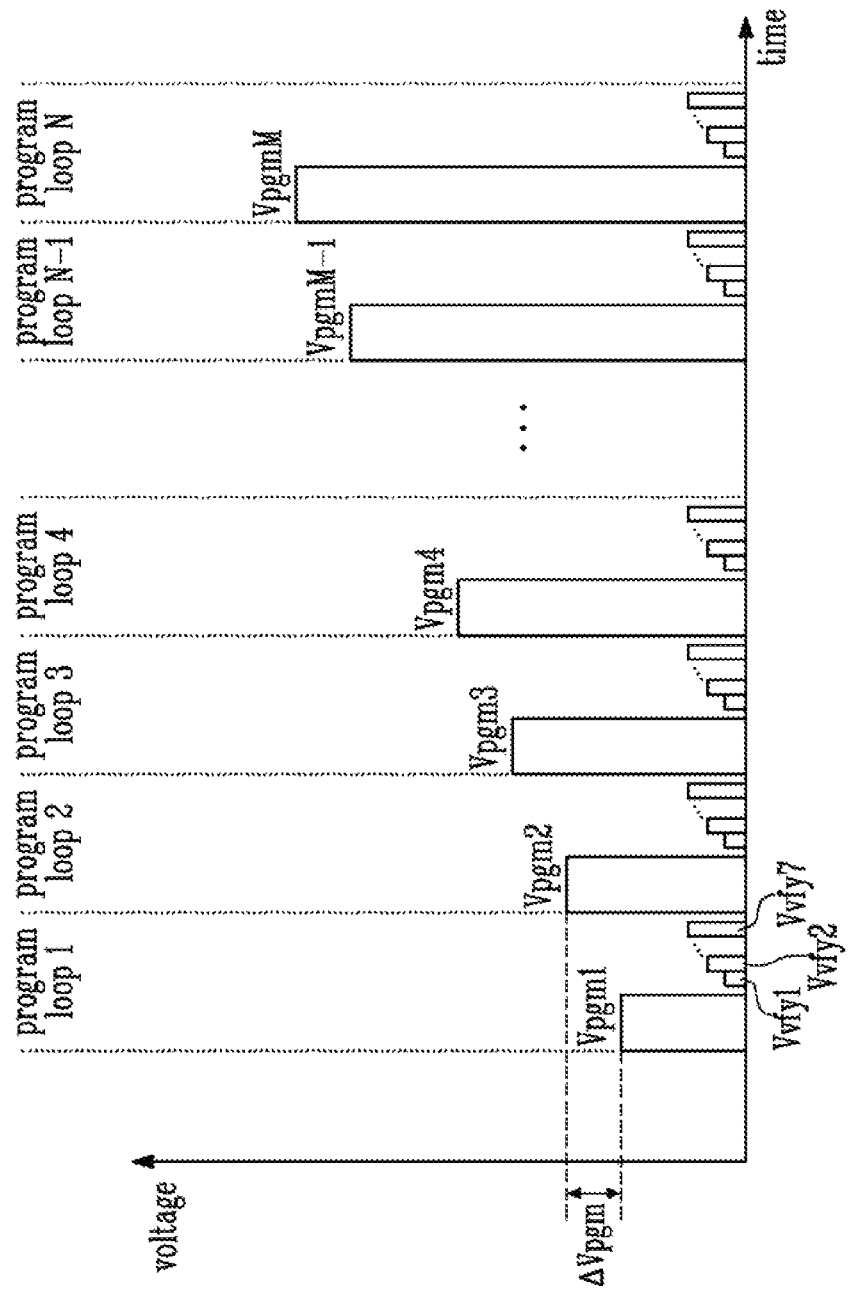
FIG. 8 is a diagram for explaining voltages applied to a selected word line during a program operation.

FIG. 8 is a diagram for explaining voltages applied to a selected word line during a program operation.

Referring to FIG. 8, a program operation of forming the program states of FIG. 7 may include N program loops. Each program loop may include an operation of applying a program voltage to a selected word line and an operation of applying a verify voltage to the selected word line. The operation of applying the program voltage may be performed during a program period, and the operation of applying the verify voltage may be performed during a program verify period. For example, the operation of applying a first program voltage Vpgm1 and a plurality of verify voltages Vvf1 to Vvf7 to the selected word line may be performed in a first program loop. Although an example in which seven verify voltages are applied in each program loop is illustrated, the operation of applying some verify voltages may be omitted during the program operation according to an embodiment.

Because each program loop is sequentially performed, the program voltage may be increased by a step voltage (ΔVpgm). For example, a second program voltage Vpgm2 applied to a selected word line in a second program loop may be higher than the first program voltage Vpgm1 by the step voltage (ΔVgpm). For convenience of description, the step voltage may be illustrated as being fixed, but it may be dynamically changed.

A memory cell having reached a target program state during the performance of N program loops may be program-inhibited so that the memory cell is not programmed any more. Even if a subsequent program loop is performed, the threshold voltage of the memory cell which has been program-inhibited may be maintained. For example, a memory cell that has been programmed to the second program state P2, which is the target program state, in the second program loop may be program-inhibited. In an embodiment, the bit line of the memory cell having reached the target program state may be precharged to a program inhibit voltage. When the bit line is precharged to the program inhibit voltage, the channel of the memory cell may be self-boosted due to the program voltage, and the memory cell is not be programmed.

As illustrated in FIG. 8, when the first to seventh verify voltages Vvfy1 to Vvfy7 are applied in each program loop, the time required for the program operation (program time) may be lengthened. The memory device 100 according to the present disclosure may shorten the program time through a blind program operation of omitting some operations of applying verify voltages. The blind program operation will be described in detail below with reference to FIGS. 9A to 17.

Figure 9A:
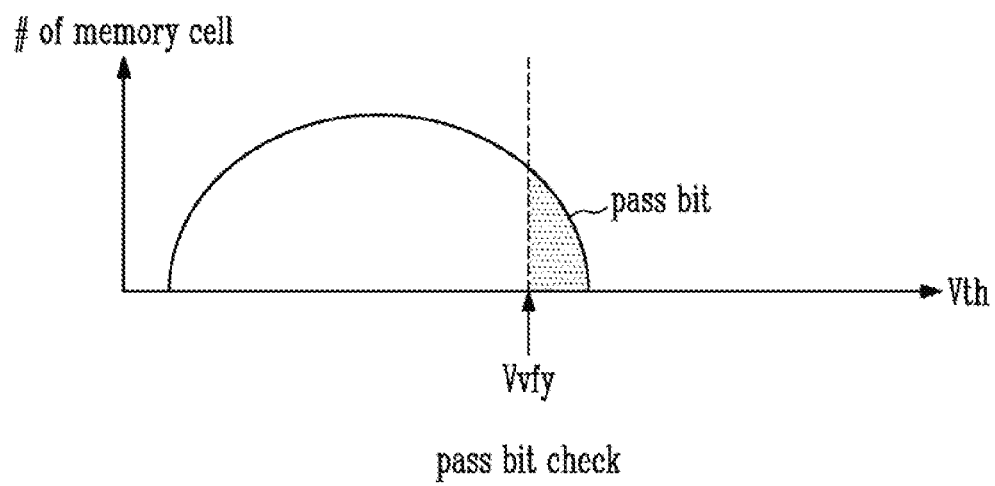
FIGS. 9A and 9B are diagrams illustrating a pass bit check operation and a fail bit check operation.
Figure 9B:
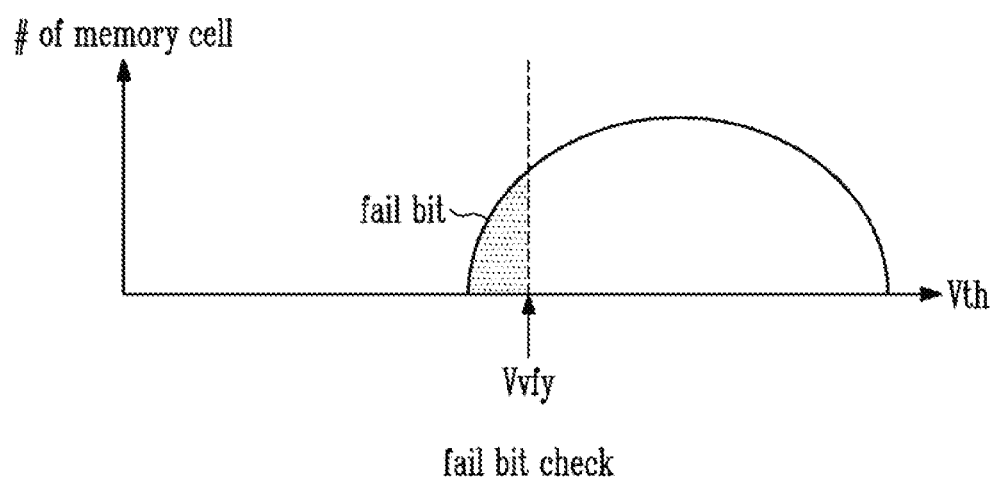

FIGS. 9A and 9B are diagrams illustrating a pass bit check operation and a fail bit check operation, respectively.

The sensing circuit 126 may perform a pass bit check operation and a fail bit check operation.

Referring to FIG. 9A, the pass bit check operation may be an operation of checking whether the number of pass bits, indicating the number of memory cells having threshold voltages higher than a verify voltage Vvfy, is greater than a first reference number. The pass bit sensing circuit 126-1 may output a pass signal to the control logic 130 when the number of pass bits is greater than the first reference number. The pass bit sensing circuit 126-1 may output a fail signal to the control logic 130 when the number of pass bits is less than the first reference number.

Referring to FIG. 9B, the fail bit check operation may be an operation of checking whether the number of fail bits, indicating the number of memory cells having threshold voltages lower than the verify voltage Vvfy, is less than a second reference number. The fail bit sensing circuit 126-2 may output a pass signal to the control logic 130 when the number of fail bits is less than the second reference number. The fail bit sensing circuit 126-2 may output a fail signal to the control logic 130 when the number of fail bits is greater than the second reference number.

Program verification for an n-th program state may be completed when the corresponding fail bit check operation passes. That is, when the number of fail bits, indicating the number of memory cells having threshold voltages lower than an n-th verify voltage, is less than the second reference number, program verification for the n-th program state may be completed.

However, when a fail bit check operation is performed in all program loops, the time required for the program operation may be lengthened. Therefore, the time required for the program operation may be shortened through a blind program operation of omitting a fail bit check operation in a specific program loop.

Figure 10:
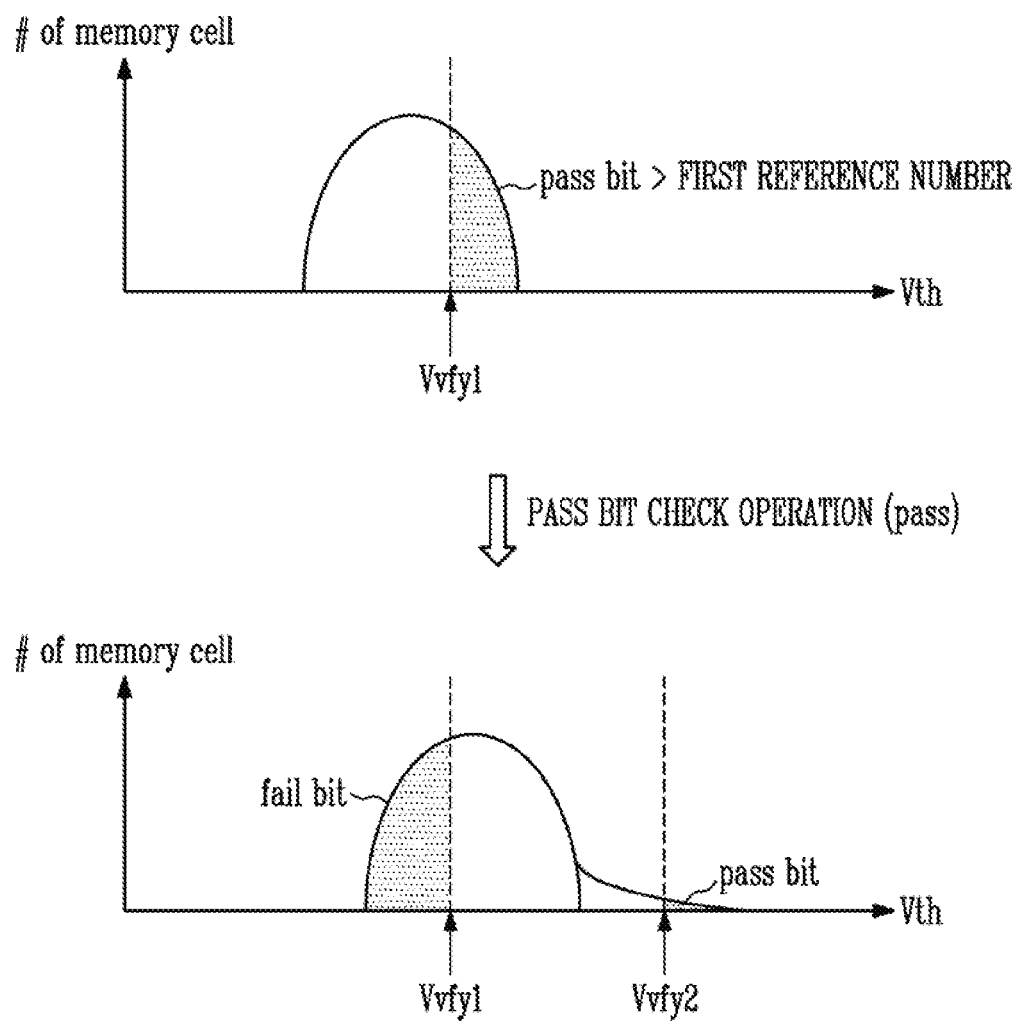
FIG. 10 is a diagram for explaining the relationship between a pass bit check operation and a fail bit check operation.

FIG. 10 is a diagram for explaining the relationship between a pass bit check operation and a fail bit check operation.

Referring to FIG. 10, the pass bit sensing circuit 126-1 may check whether the number of pass bits, indicating the number of memory cells having threshold voltages higher than a first verify voltage Vvfy1, is greater than a first reference number during a check period for program verification for a first program state P1.

When the pass bit sensing circuit 126-1 outputs a pass signal to the control logic 130, the program operation controller 131 may control the peripheral circuit 120 so that the first verify voltage Vvfy1 and a second verify voltage Vvfy2 are applied to a selected word line in a subsequent program loop. For example, when the pass bit sensing circuit 126-1 outputs a pass signal to the control logic 130 in a first program loop (program loop 1), the first verify voltage Vvfy1 and the second verify voltage Vvfy2 may be applied to a selected word line in a second program loop (program loop 2).

In the second program loop (program loop 2), information about the voltage of the bit line sensed using the first verify voltage Vvfy1 may be transferred to the fail bit sensing circuit 126-2. The fail bit sensing circuit 126-2 may check whether the number of fail bits, indicating the number of memory cells having threshold voltages lower than the first verify voltage Vvfy1, is less than a second reference number.

In the second program loop (program loop 2), information about the voltage of the bit line sensed using the second verify voltage Vvfy2 may be transferred to the pass bit sensing circuit 126-1. The pass bit sensing circuit 126-1 may check whether the number of pass bits, indicating the number of memory cells having threshold voltages higher than the second verify voltage Vvfy2, is greater than the first reference number.

When the pass bit check operation for the first program state has passed, a fail bit check operation for the first program state and a pass bit check operation for a second program state may be performed in a subsequent program loop. That is, the pass bit check operation may be performed to determine a program loop in which a fail bit check operation is to be started.

However, because, in the subsequent program loop, the number of pass bits, indicating the number of memory cells having threshold voltages higher than the second verify voltage Vvfy2, is not large, the pass bit check operation for the second program state may also be performed in a program loop after a preset number of program loops have been performed.

FIG. 11 is a diagram illustrating a check operation performed during a program operation on a first page.

Referring to FIG. 11, during a program operation for a first program state P1, a pass bit check operation may be performed during a check period of a first program loop (program loop 1). The pass bit sensing circuit 126-1 may output a pass signal to the control logic 130. That is, the pass bit check operation for the first program state P1 may pass in the first program loop (program loop 1).

When the pass bit check operation for the first program state P1 passes, a fail bit check operation for the first program state P1 may be performed during a check period of a second program loop (program loop 2). The fail bit sensing circuit 126-2 may output a fail signal to the control logic 130 in the second program loop (program loop 2) to a fourth program loop (program loop 4). During a check period of a fifth program loop (program loop 5), the fail bit sensing circuit 126-2 may output a pass signal to the control logic 130. That is, the fail bit check operation for the first program state P1 may pass in the fifth program loop (program loop 5).

When the pass bit check operation for the first program state P1 passes, a pass bit check operation for a second program state P2 may be performed during the check period of the second program loop (program loop 2). However, because the number of pass bits for the second program state P2 in the second program loop (program loop 2) may be small, the pass bit check operation for the second program state P2 may also be performed after a preset number of program loops have been performed. For convenience of description, a description will be made on the assumption that, when a pass bit check operation for a first program state P1 has passed, a pass bit check operation for a second program state P2 is performed during a check period of a subsequent program loop.

The pass bit check operation for the second program state P2 may be performed to a fourth program loop (program loop 4). That is, during a check period of the fourth program loop (program loop 4), the pass bit sensing circuit 126-1 may output a pass signal to the control logic 130.

When the pass bit check operation for the second program state P2 passes, a fail bit check operation for the second program state P2 may be performed during a check period of a fifth program loop (program loop 5). The fail bit sensing circuit 126-2 may output a fail signal to the control logic 130 in the fifth program loop (program loop 5) to a ninth program loop (program loop 9). During a check period of a tenth program loop (program loop 10), the fail bit sensing circuit 126-2 may output a pass signal to the control logic 130. That is, the fail bit check operation for the second program state P2 may pass in the tenth program loop (program loop 10).

When the pass bit check operation for the second program state P2 passes, a pass bit check operation for a third program state P3 may be performed during the check period of the fifth program loop (program loop 5). However, because the number of pass bits for the third program state P3 in the fifth program loop (program loop 5) may be small, the pass bit check operation for the third program state P3 may also be performed after a preset number of program loops have been performed. For convenience of description, a description will be made on the assumption that, when the pass bit check operation for the second program state P2 has passed, a pass bit check operation for a third program state P3 is performed during a check period of a subsequent program loop.

In the same manner, a fail bit check operation for the third program state P3 may be performed in a ninth program loop (program loop 9) to a fourteenth program loop (program loop 14). A pass bit check operation for the fourth program state P4 may be performed in the ninth program loop (program loop 9) to a thirteenth program loop (program loop 13). A fail bit check operation for the fourth program state P4 may be performed from the fourteenth program loop (program loop 14).

The program operation controller 131 may perform control such the pass bit sensing circuit 126-1 is first operated for each program state and such that, when a pass signal is received from the pass bit sensing circuit 126-1, the fail bit sensing circuit 126-2 is operated from a subsequent program loop.

When a pass signal is received from the pass bit sensing circuit 126-1, the start loop manager 132 may determine the number of a current program loop, and may generate start loop information that is information about a program loop subsequent to the current program loop.

The program operation controller 131 may receive the start loop information from the start loop manager 132, and may perform a program operation on a second page based on the start loop information.

Figure 12:
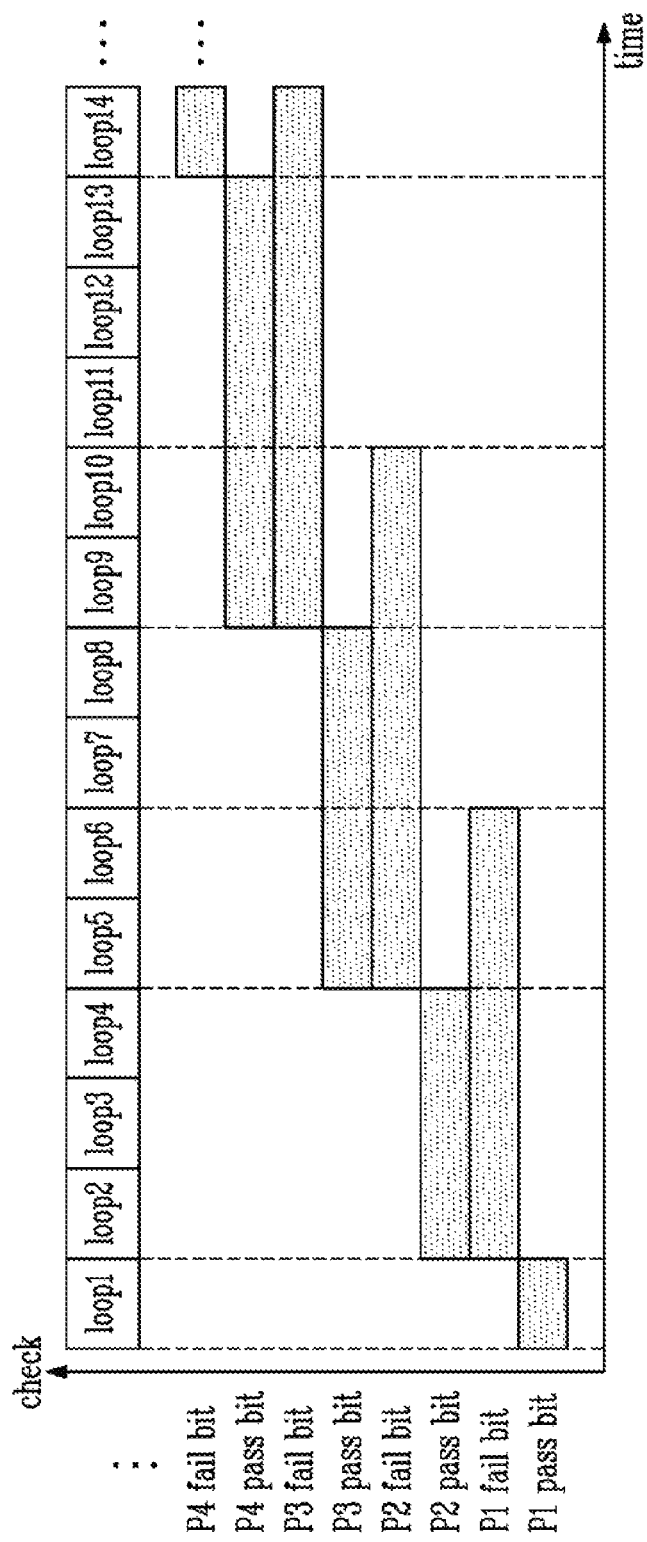
FIG. 12 is a diagram illustrating check operations performed in respective program loops during a program operation on a first page.

FIG. 12 is a diagram illustrating check operations performed in respective program loops during a program operation on a first page.

Referring to FIG. 12, a pass bit check operation for a first program state P1 may be performed in a first program loop (program loop 1). The pass bit check operation for the first program state P1 may be performed using a first verify voltage. In the first program loop (program loop 1), the pass bit check operation for the first program state P1 may pass.

When the pass bit check operation for the first program state P1 has passed in the first program loop 1, a fail bit check operation for the first program state P1 may be performed from a second program loop (program loop 2). The fail bit check operation for the first program state P1 may be performed using a first verify voltage. The fail bit check operation for the first program state P1 may be performed in the second program loop (program loop 2) to a sixth program loop (program loop 6). That is, the fail bit check operation for the first program state P1 may pass in the sixth program loop (program loop 6).

When the pass bit check operation for the first program state P1 has passed in the first program loop (program loop 1), a pass bit check operation for a second program state P2 may be performed from the second program loop (program loop 2) or after a preset number of program loops have been performed. The pass bit check operation for the second program state P2 may be performed using a second verify voltage. The pass bit check operation for the second program state P2 may pass in the program loop without separating a case where the corresponding pass bit check operation is to be performed from the second program loop (program loop 2) and a case where the corresponding pass bit check operation is to be performed after a preset number of program loops have been performed. For example, the pass bit check operation for the second program state P2 may pass in the fourth program loop (program loop 4). Therefore, in order to reduce the time required for the program operation, it is desirable to perform the pass bit check operation for the second program state P2 after a preset number of program loops have been performed. However, for convenience of description, it is assumed that the pass bit check operation for the second program state P2 is performed from the second program loop (program loop 2).

When the pass bit check operation for the second program state P2 has passed in the fourth program loop (program loop 4), the fail bit check operation for the second program state P2 may be performed from the fifth program loop (program loop 5). The pass bit check operation for the second program state P2 may be performed using the second verify voltage. The fail bit check operation for the second program state P2 may be performed in the fifth program loop (program loop 5) to a tenth program loop (program loop 10). That is, the fail bit check operation for the second program state P2 may pass in the tenth program loop (program loop 10).

When the pass bit check operation for the second program state P2 has passed in the fourth program loop (program loop 4), a pass bit check operation for a third program state P3 may be performed from the fifth program loop (program loop 5) or after a preset number of program loops have been performed. The pass bit check operation for the third program state P3 may be performed using a third verify voltage.

In the same way, the check operation to be performed in each program loop may be determined. When a plurality of check operations are performed in the corresponding program loop, a plurality of verify voltages should be able to be applied so as to acquire sensing voltages to be used for the check operations. That is, although only one verify voltage needs to be applied in the first program loop (program loop 1), two verify voltages should be able to be applied in the second program loop (program loop 2) to the fourth program loop (program loop 4), the seventh program loop (program loop 7), the eighth program loop (program loop 8), and the eleventh program loop (program loop 11) to the fourteenth program loop (program loop 14). Meanwhile, three verify voltages may be applied in the fifth program loop (program loop 5), the sixth program loop (program loop 6), the ninth program loop (program loop 9), and the tenth program loop (program loop 10).

The program operation controller 131 may control the peripheral circuit 120 and the sensing circuit 126 so that a fail bit check operation is performed from a program loop subsequent to the program loop in which the pass bit check operation has passed. The start loop manager 132 may generate start loop information based on the program loop in which the pass bit check operation has passed by receiving a pass signal from the sensing circuit 126.

Figure 13:
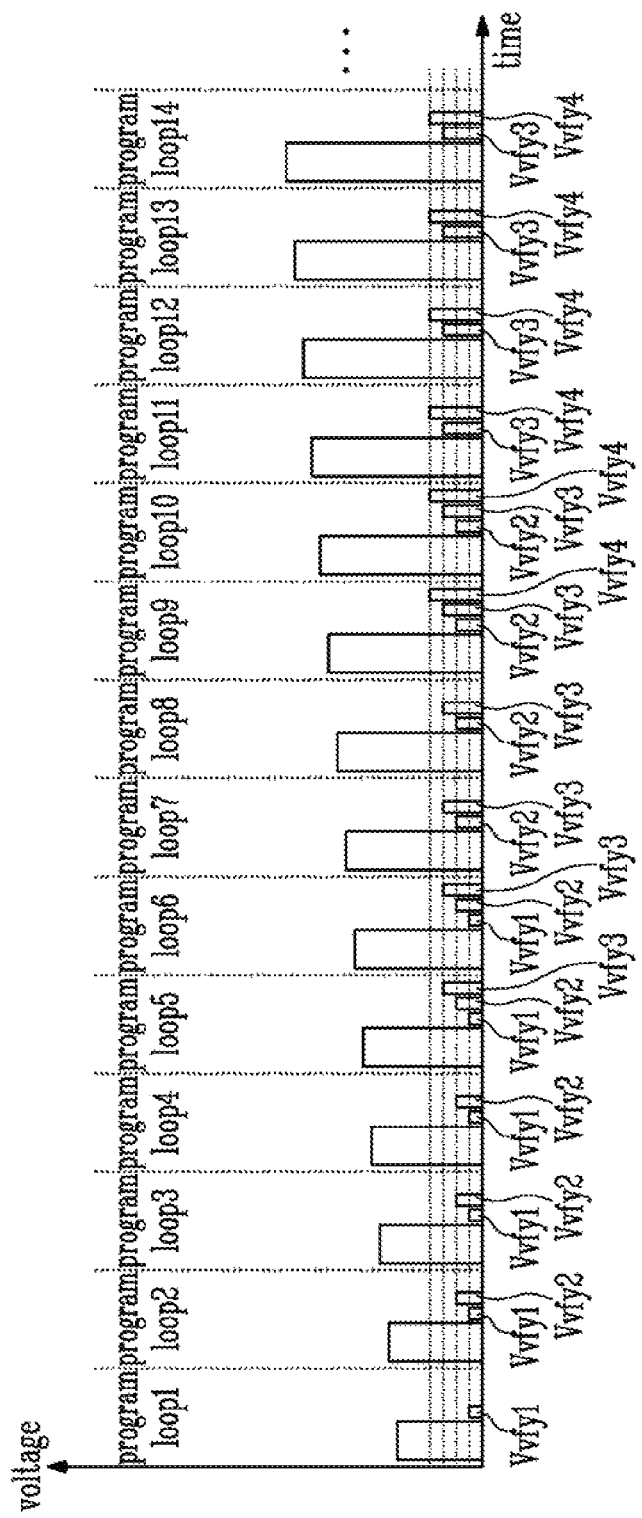
FIG. 13 is a diagram for explaining operating voltages applied to a selected word line.

FIG. 13 is a diagram for explaining operating voltages applied to a selected word line.

Referring to FIG. 13, the program operation controller 131 may control the peripheral circuit 120 so that, during a sensing period of a first program loop (program loop 1), a first verify voltage Vvfy1 is applied to a selected word line. Also, the program operation controller 131 may transfer a control signal to the sensing circuit 126 so that the pass bit sensing circuit 126-1 is operated during a check period of the first program loop (program loop 1).

When the pass bit sensing circuit 126-1 outputs a pass signal to the control logic 130, the program operation controller 131 may control the peripheral circuit 120 so that the first verify voltage Vvfy1 and a second verify voltage Vvfy2 are applied to a selected word line during a sensing period of a second program loop (program loop 2). Also, the program operation controller 131 may transfer a control signal to the sensing circuit 126 so that, during a check period of the second program loop (program loop 2), a voltage sensed using the first verify voltage Vvfy1 is transferred to the fail bit sensing circuit 126-2 and a voltage sensed using the second verify voltage Vvfy2 is transferred to the pass bit sensing circuit 126-1.

As described above with reference to FIG. 12, the program operation controller 131 may control the peripheral circuit 120 so that one verify voltage is applied to a selected word line in a first program loop (program loop 1). The program operation controller 131 may control the peripheral circuit 120 so that two verify voltages are applied to a selected word line in a second program loop (program loop 2) to a fourth program loop (program loop 4), a seventh program loop (program loop 7), an eighth program loop (program loop 8), and an eleventh program loop (program loop 11) to a fourteenth program loop (program loop 14). The program operation controller 131 may control the peripheral circuit 120 so that three verify voltages are applied to a selected word line in a fifth program loop (program loop 5), a sixth program loop (program loop 6), a ninth program loop (program loop 9), and a tenth program loop (program loop 10).

The program operation controller 131 may perform the program operation, described above with reference to FIGS. 11 to 13, on a first page, among a plurality of pages included in the memory cell array 110. The program operation controller 131 may perform a blind program operation, which will be described later with reference to FIGS. 15 and 16, on a second page, among the plurality of pages included in the memory cell array 110. Referring to FIGS. 11 to 13, when the program operation is performed on the first page, the time required for the program operation may be shortened compared to a case where first to seventh verify voltages Vvfy1 to Vvfy7 are applied in all program loops, as illustrated in FIG. 8. Also, by means of the blind program operation, which will be described later with reference to FIGS. 15 and 16, the time required for the program operation on the second page may be further shortened than that required for the program operation on the first page.

Figure 14:
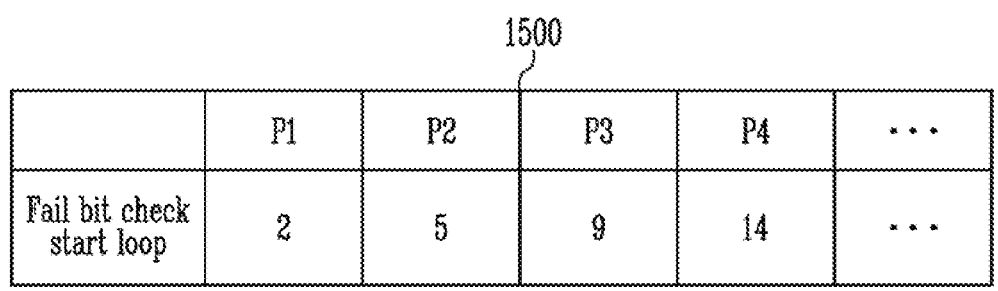
FIG. 14 is a diagram for explaining start loop information.

FIG. 14 is a diagram for explaining start loop information.

Referring to FIG. 14, the start loop manager 132 may generate start loop information 1500. The start loop manager 132 may receive a pass signal from the pass bit sensing circuit 126-1, and may generate start loop information 1500 about a program loop in which a fail bit check operation is to be performed.

The start loop manager 132 may set a program loop subsequent to the program loop, in which a pass bit check operation has passed for each program state, as the program loop in which the fail bit check operation is to be performed. For example, when a pass bit check operation for a first program state P1 has passed in the first program loop (program loop 1), a program loop in which a fail bit check operation for the first program state P1 starts may be set to a second program loop (program loop 2). When a pass bit check operation for a second program state P2 has passed in a fourth program loop (program loop 4), a program loop in which a fail bit check operation for the second program state P2 starts may be set to a fifth program loop (program loop 5). When a pass bit check operation for a third program state P3 has passed in an eighth program loop (program loop 8), a program loop in which a fail bit check operation for the third program state P3 starts may be set to a ninth program loop (program loop 9). When a pass bit check operation for a fourth program state P4 has passed in a thirteenth program loop (program loop 13), a program loop in which a fail bit check operation for the fourth program state P4 starts may be set to a fourteenth program loop (program loop 14).

In accordance with the start loop information 1500, a fail bit check operation for each program state might not need to be performed in all program loops. Also, because the program loop in which a fail bit check operation starts has been determined based on the pass bit check operation, the distribution of threshold voltages may be maintained even if fail bit check operations are omitted in some program loops based on the start loop information 1500.

Figure 15:
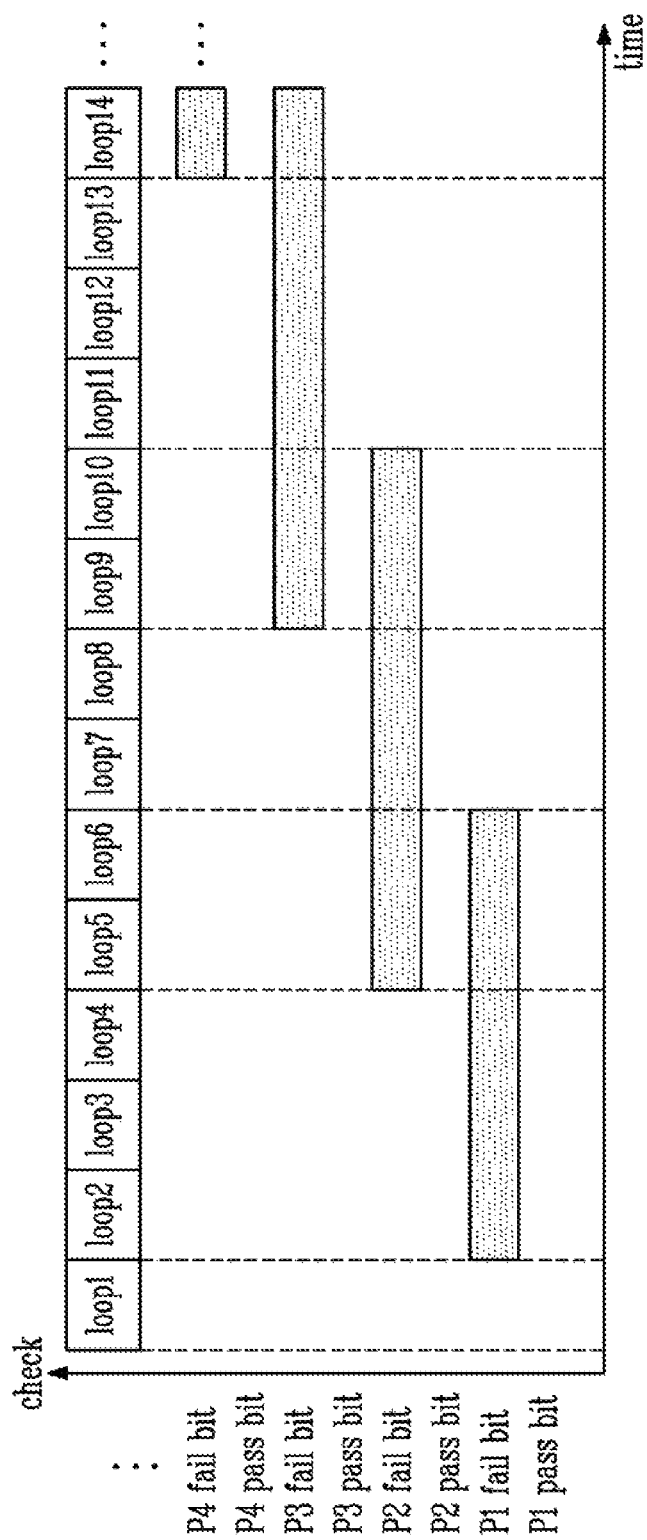
FIG. 15 is a diagram for explaining check operations performed in respective program loops during a program operation on a second page.

FIG. 15 is a diagram for explaining check operations performed in respective program loops during a program operation on a second page.

Referring to FIG. 15, the program operation controller 131 may perform a blind program operation during a program operation on a second page to be programmed subsequent to a first page, among a plurality of pages sequentially programmed. In detail, the program operation controller 131 may perform the blind program operation based on start loop information generated in the program operation on the first page. The program operation controller 131 may receive the start loop information 1500 from the start loop manager 132, and may perform the blind program operation.

In detail, the program operation controller 131 might not perform a verify operation in the first program loop (program loop 1) based on the start loop information 1500. The program operation controller 131 may control the peripheral circuit 120 and the sensing circuit 260 so that a fail bit check operation for a first program state P1 is performed from the second program loop (program loop 2) based on the start loop information 1500. The program operation controller 131 may control the peripheral circuit 120 and the sensing circuit 260 so that a fail bit check operation for a second program state P2 is performed from a fifth program loop (program loop 5) based on the start loop information 1500. The program operation controller 131 may control the peripheral circuit 120 and the sensing circuit 126 so that a fail bit check operation for a third program state P3 is performed from a ninth program loop (program loop 9) based on the start loop information 1500. The program operation controller 131 may control the peripheral circuit 120 and the sensing circuit 126 so that a fail bit check operation for a fourth program state P4 is performed from a fourteenth program loop (program loop 14) based on the start loop information 1500.

In the same way, the program operation controller 131 may perform fail bit check operations for fifth to seventh program states P5 to P7.

Compared to the program operation performed on the first page, described above with reference to FIG. 12, the pass bit check operation may be omitted, and thus the time required for the program operation may be shortened. Meanwhile, because a verify voltage apply operation necessarily involved to perform the pass bit check operation may also be omitted, the time required for the program operation (program operation time) may be shortened.

In comparison with the description made with reference to FIG. 8, first to seventh verify voltages Vvfy1 to Vvfy7 are not applied in all program loops, but operations of applying some verify voltages may be omitted, thus shortening the time required for the program operation.

Figure 16:
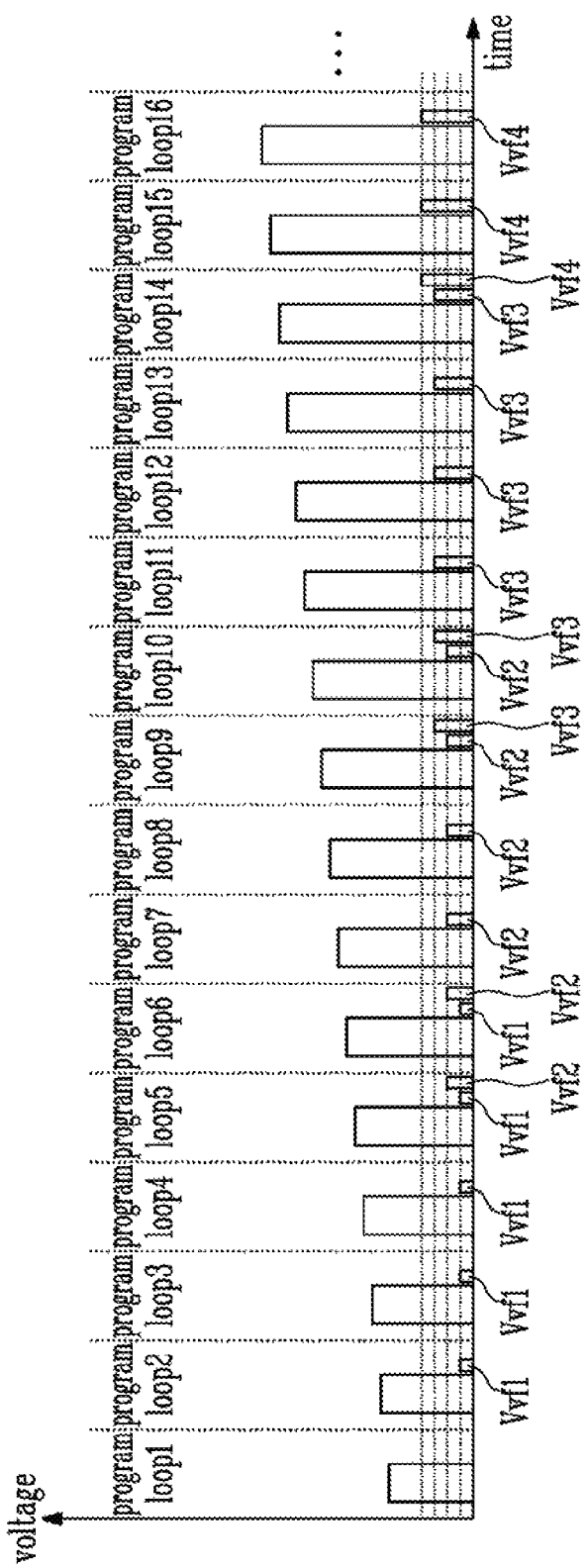
FIG. 16 is a diagram for explaining operating voltages applied to a selected word line during a program operation on a second page.

FIG. 16 is a diagram for explaining operating voltages applied to a selected word line during a program operation on a second page.

Referring to FIG. 16, the program operation controller 131 may control the peripheral circuit 120 so that, during a sensing period of a first program loop (program loop 1), a verify voltage is not applied.

The program operation controller 131 may control the peripheral circuit 120 so that, during a sensing period of a second program loop (program loop 2), a first verify voltage Vvfy1 is applied to a selected word line. Also, the program operation controller 131 may transfer a control signal to the sensing circuit 126 so that, during a check period of the second program loop (program loop 2), a voltage sensed using the first verify voltage Vvfy1 is transferred to the fail bit sensing circuit 126-2.

That is, as illustrated in FIG. 16, the program operation controller 131 may control the peripheral circuit 120 to apply a verify voltage to a selected word line so that a fail bit check operation is performed in each program loop.

During a blind program operation on the second page, the program operation controller 131 may complete the program operation by applying a smaller number of verify voltages than a number of verify voltages applied during the program operation on the first page, as illustrated in FIG. 13. The program operation controller 131 may further shorten the program operation time through the blind program operation on the second page.

Figure 17:
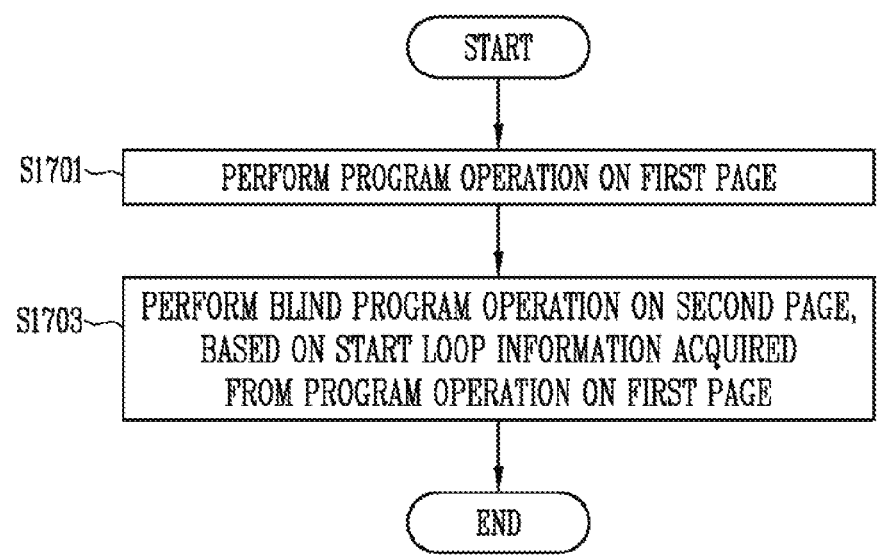
FIG. 17 is a flowchart illustrating a program method according to an embodiment.

FIG. 17 is a flowchart illustrating a program method according to an embodiment.

Referring to FIG. 17, at step S1701, the program operation controller 131 may perform a program operation on a first page, among a plurality of pages to be sequentially programmed. In detail, the program operation controller 131 may control the peripheral circuit 120 and the sensing circuit 126 so that a plurality of memory cells included in the first page are programmed to a plurality of program states.

The start loop manager 132 may generate start loop information based on a program loop in which program verification for a plurality of program states has passed during programming to the first page. A method of generating the start loop information may be identical to that described with reference to FIGS. 11 to 14.

At step S1703, the program operation controller 131 may perform a blind program operation on a second page to be programmed subsequent to the first page, among the plurality of pages. In detail, the program operation controller 131 may receive the start loop information from the start loop manager 132, and may perform a program operation based on the start loop information. The blind program operation may be identical to that described above with reference to FIGS. 14 to 16.

Figure 18:
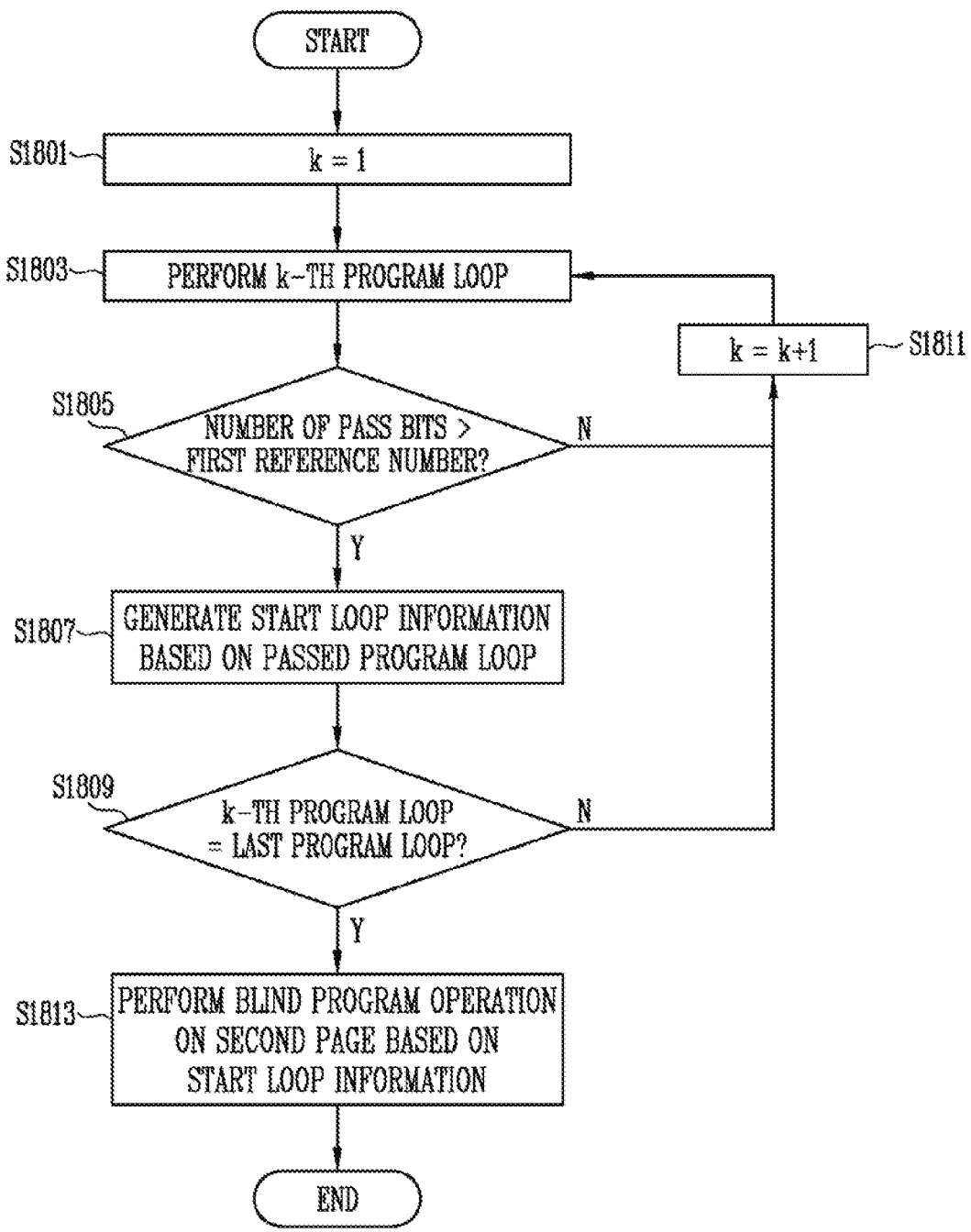
FIG. 18 is a flowchart illustrating in detail a program operation performed on a first page.

FIG. 18 is a flowchart illustrating in detail a program operation performed on a first page.

Referring to FIG. 18, at steps S1801 to S1811, the program operation controller 131 may sequentially perform program loops ranging from a first program loop to a last program loop on the first page, and the start loop manager 132 may generate start loop information.

In detail, at step S1803, the program operation controller 131 may perform the first program loop. When performing the program loop, the program operation controller 131 may apply a program voltage to a selected word line during a program period, and may apply a verify voltage to a selected word line during a program verify period.

At step S1805, the pass bit sensing circuit 126-1 may check whether the number of pass bits, indicating the number of memory cells having threshold voltages higher than the verify voltage, among the memory cells included in the first page, is greater than a first reference number. The pass bit sensing circuit 126-1 may output a pass signal to the control logic 130 when the number of pass bits is greater than the first reference number. The pass bit sensing circuit 126-1 may output a fail signal to the control logic 130 when the number of pass bits is less than or equal to the first reference number. When the number of pass bits is greater than the first reference number, the process may proceed to step S1807, whereas when the number of pass bits is less than or equal to the first reference number, the process may proceed to step S1811.

At step S1807, the start loop manager 132 may generate start loop information based on a program loop in which the pass bit check operation has passed. In detail, a program loop subsequent to the program loop in which the pass bit check operation has passed may be set as a program loop in which the fail bit check operation is to be performed. The fail bit check operation may determine whether the number of fail bits, indicating the number of memory cells having threshold voltages lower than the corresponding verify voltage, is less than a second reference number. The fail bit sensing circuit 126-2 may perform a fail bit check operation. The fail bit sensing circuit 126-2 may output a pass signal to the control logic 130 when the number of fail bits is less than the second reference number. The fail bit sensing circuit 126-2 may output a fail signal to the control logic 130 when the number of fail bits is equal to or greater than the second reference number.

At step S1809, the program operation controller 131 may determine whether a current program loop is a last program loop. When it is determined that the current program loop is not a last program loop, the process may proceed to step S1811, whereas when it is determined that the current program loop is the last program loop, the process may proceed to step S1813.

At step S1811, when the program loop is changed to a subsequent program loop (k=k+1), and the program voltage may be increased by a step voltage.

At step S1813, the program operation controller 131 may perform a blind program operation on a second page to be programmed subsequent to the first page, among the plurality of pages, based on the start loop information. The blind program operation may be a program operation of omitting program verification in a program loop to be performed prior to the program loop determined based on the start loop information.

Figure 19:
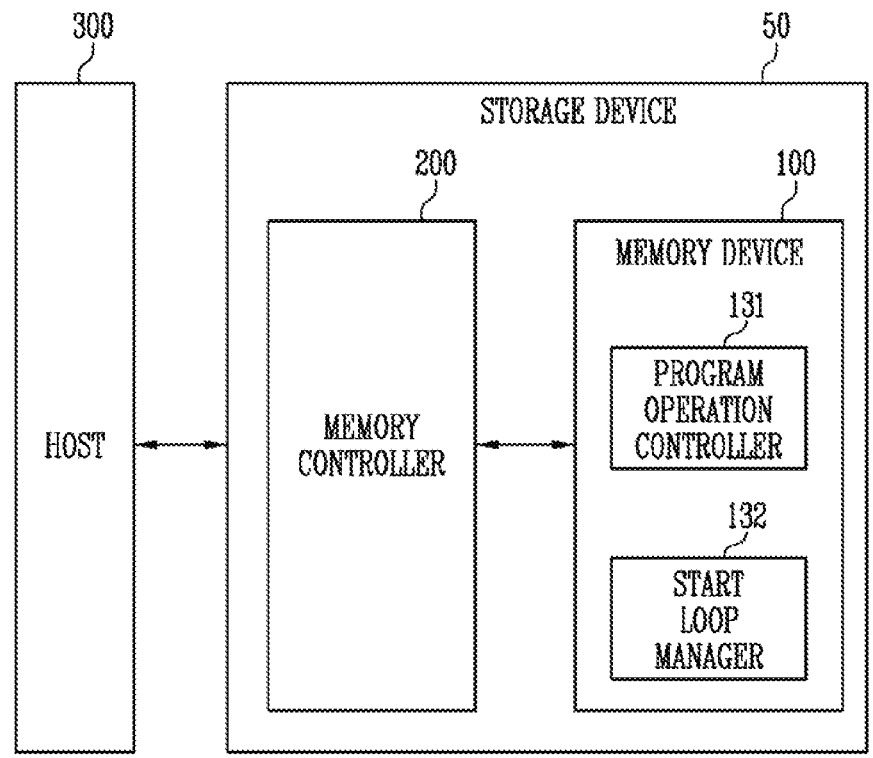
FIG. 19 is a block diagram illustrating a storage device.

FIG. 19 is a block diagram illustrating a storage device.

Referring to FIG. 19, a storage device 50 may include a memory device 100 and a memory controller 200 which controls the operation of the memory device.

The storage device 50 may be a device which stores data under the control of a host 300, such as a mobile phone, a smartphone, an MP3 player, a laptop computer, a desktop computer, a game console, a TV, a tablet PC, or an in-vehicle infotainment system.

The storage device 50 may be manufactured as any one of various types of storage devices depending on a host interface which is a communication method with the host 300. For example, the storage device 50 may be implemented as any one of various types of storage devices, for example, a solid state disk (SSD), a multimedia card such as an MMC, an embedded MMC (eMMC), a reduced size MMC (RS-MMC), or a micro-MMC, a secure digital card such as an SD, a mini-SD, or a micro-SD, a universal storage bus (USB) storage device, a universal flash storage (UFS) device, a personal computer memory card international association (PCMCIA) card-type storage device, a peripheral component interconnection (PCI)-card type storage device, a PCI express (PCI-E) card-type storage device, a compact flash (CF) card, a smart media card, and a memory stick.

The storage device 50 may be manufactured in any one of various types of package forms. For example, the storage device 50 may be manufactured in any one of various types of package forms, such as package on package (POP), system in package (SIP), system on chip (SOC), multi-chip package (MCP), chip on board (COB), wafer-level fabricated package (WFP), and wafer-level stack package (WSP).

The memory device 100 may store data. The memory device 100 is operated in response to the control of the memory controller 200.

The memory device 100 may include a memory cell array. The memory cell array may include a plurality of memory cells which store data. Each of the memory cells may be implemented as a single-level cell (SLC) capable of storing one data bit, a multi-level cell (MLC) capable of storing two data bits, a triple-level cell (TLC) capable of storing three data bits, or a quad-level cell (QLC) capable of storing four data bits.

The memory cell array may include a plurality of memory blocks. Each memory block may include a plurality of memory cells. A single memory block may include a plurality of pages. In an embodiment, each page may be a unit by which data is stored in the memory device 100 or by which data stored in the memory device 100 is read. A memory block may be a unit by which data is erased.

In an embodiment, the memory device 100 may include many alternative forms of memory, such as double data rate synchronous dynamic random access memory (DDR SDRAM), low power double data rate fourth generation (LPDDR4) SDRAM, graphics double data rate (GDDR) SDRAM, low power DDR (LPDDR) SDRAM, Rambus dynamic random access memory (RDRAM), NAND flash memory, vertical NAND flash memory, NOR flash memory device, resistive RAM (RRAM), phase-change memory (PRAM), magnetoresistive RAM (MRAM), ferroelectric RAM (FRAM), or spin transfer torque RAM (STT-RAM). In the present specification, for convenience of description, a description will be made on the assumption that the memory device 100 includes NAND flash memory.

The memory device 100 may receive a command and an address from the memory controller 200. The memory device 100 may access an area, selected by the received address, in the memory cell array. Accessing the selected area may mean that an operation corresponding to the received command is performed on the selected area. For example, the memory device 100 may perform a write operation (i.e., a program operation), a read operation, and an erase operation. During a program operation, the memory device 100 may program data to the area selected by the address. During a read operation, the memory device 100 may read data from the area selected by the address. During an erase operation, the memory device 100 may erase data stored in the area selected by the address.

In an embodiment, the memory device 100 may include a program operation controller 131 and a start loop manager 132.

The program operation controller 131 may receive a program command and an address from the memory controller 200, and may perform a program operation of programming data to an area of the memory cell array indicated by the address. The program operation controller 131 may perform a plurality of program loops so as to perform a program operation. The program loop may include a program period and a program verify period. During the program period, the program operation controller 131 may control the program operation so that a program voltage is applied to a selected word line. During the program verify period, the program operation controller 131 may control the program operation so that a verify voltage is applied to a selected word line.

The start loop manager 132 may manage start loop information about which one of first to seventh verify voltages Vvfy1 to Vvfy7 is to be applied to a selected word line during the program verify period.

The program operation controller 131 may control the program operation so that a verify voltage selected from among the first to seventh verify voltages Vvfy1 to Vvfy7 based on the start loop information is applied to the selected word line.

When power is applied to the storage device 50, the memory controller 200 may run firmware (FW). The firmware (FW) may include a host interface layer (HIL) which receives a request input from the host 300 or outputs a response to the host 300, a flash translation layer (FTL) which manages an operation between the interface of the host 300 and the interface of the memory device 100, and a flash interface layer (FIL) which provides a command to the memory device 100 or receives a response from the memory device 100.

The memory controller 200 may receive data and a logical address (LA) from the host 300, and may translate the logical address into a physical address (PA) indicating the address of memory cells which are included in the memory device 100 and in which data is to be stored. The logical address may be a logical block address (LBA), and the physical address may be a physical block address (PBA).

The memory controller 200 may control the memory device 100 so that a program operation, a read operation or an erase operation is performed in response to a request received from the host 300. During the program operation, the memory controller 200 may provide a program command, a physical block address, and data to the memory device 100. During the read operation, the memory controller 200 may provide a read command and a physical block address to the memory device 100. During the erase operation, the memory controller 200 may provide an erase command and a physical block address to the memory device 100.

The memory controller 200 may control the memory device 100 so that a program operation, a read operation or an erase operation is autonomously performed regardless of a request received from the host 300. For example, the memory controller 200 may control the memory device 100 so that a program operation, a read operation or an erase operation to be used to perform background operations, such as wear leveling, garbage collection, and read reclaim operations, is performed.

The host 300 may communicate with the storage device 50 using at least one of various communication methods such as Universal Serial Bus (USB), Serial AT Attachment (SATA), Serial Attached SCSI (SAS), High Speed Interchip (HSIC), Small Computer System Interface (SCSI), Peripheral Component Interconnection (PCI), PCI express (PCIe), Nonvolatile Memory express (NVMe), Universal Flash Storage (UFS), Secure Digital (SD), MultiMedia Card (MMC), embedded MMC (eMMC), Dual In-line Memory Module (DIMM), Registered DIMM (RDIMM), and Load Reduced DIMM (LRDIMM) communication methods.

Figure 20:
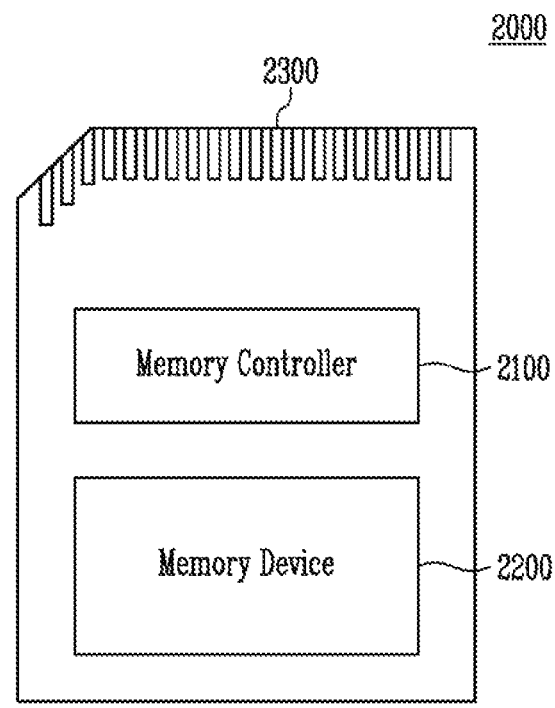
FIG. 20 is a block diagram illustrating a memory card system to which a storage device according to an embodiment of the present disclosure is applied.

FIG. 20 is a block diagram illustrating a memory card system to which the storage device according to an embodiment of the present disclosure is applied.

Referring to FIG. 20, a memory card system 2000 may include a memory controller 2100, a memory device 2200, and a connector 2300.

The memory controller 2100 is coupled to the memory device 2200. The memory controller 2100 may access the memory device 2200. For example, the memory controller 2100 may be control read, write, erase, and background operations of the memory device 2200. The memory controller 2100 may provide an interface between the memory device 2200 and a host. The memory controller 2100 may run firmware for controlling the memory device 2200.

In an embodiment, the memory controller 2100 may include components, such as a RAM, a processor, a host interface, a memory interface, and an ECC circuit.

The memory controller 2100 may communicate with an external device through the connector 2300. The memory controller 2100 may communicate with an external device (e.g., a host) based on a specific communication protocol. In an embodiment, the memory controller 2100 may communicate with the external device through at least one of various communication protocols such as universal serial bus (USB), multimedia card (MMC), embedded MMC (eMMC), peripheral component interconnection (PCI), PCI-express (PCI-E), advanced technology attachment (ATA), serial-ATA (SATA), parallel-ATA (PATA), small computer small interface (SCSI), enhanced small disk interface (ESDI), integrated drive electronics (IDE), Firewire, universal flash storage (UFS), Wi-Fi, Bluetooth, and nonvolatile memory express (NVMe) protocols. In an embodiment, the connector 2300 may be defined by at least one of the above-described various communication protocols.

In an embodiment, the memory device 2200 may be implemented as any of various nonvolatile memory devices, such as an Electrically Erasable and Programmable ROM (EEPROM), a NAND flash memory, a NOR flash memory, a Phase-change RAM (PRAM), a Resistive RAM (ReRAM), a Ferroelectric RAM (FRAM), a Spin-Torque Magnetic RAM (STT-MRAM).

The memory controller 2100 and the memory device 2200 may be integrated into a single semiconductor device to configure a memory card. For example, the memory controller 2100 and the memory device 2200 may be integrated into a single semiconductor device to configure a memory card such as a PC card (personal computer memory card international association: PCMCIA), a compact flash card (CF), a smart media card (SM or SMC), a memory stick, a multimedia card (MMC, RS-MMC, MMCmicro or eMMC), a SD card (SD, miniSD, microSD, or SDHC), or a universal flash storage (UFS).

Figure 21:
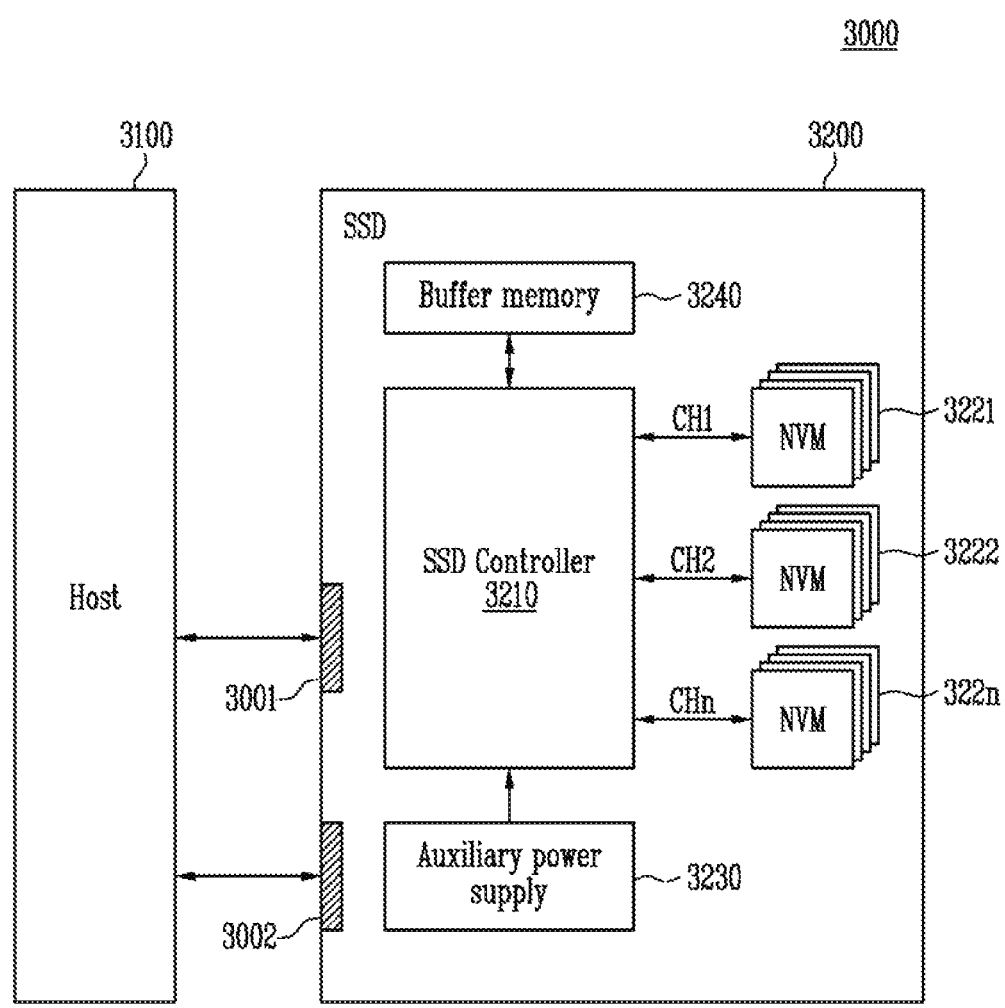
FIG. 21 is a block diagram illustrating an example of a solid state drive (SSD) system to which a storage device according to an embodiment of the present disclosure is applied.

FIG. 21 is a block diagram illustrating an example of a solid state drive (SSD) system to which the storage device according to an embodiment of the present disclosure is applied.

Referring to FIG. 21, an SSD system 3000 may include a host 3100 and an SSD 3200. The SSD 3200 may exchange signals SIG with the host 3100 through a signal connector 3001 and may receive power PWR through a power connector 3002. The SSD 3200 may include an SSD controller 3210, a plurality of flash memories 3221 to 322n, an auxiliary power supply 3230, and a buffer memory 3240.

In an embodiment, the SSD controller 3210 may perform the function of the memory controller 200 described above with reference to FIG. 1.

The SSD controller 3210 may control the plurality of flash memories 3221 to 322n in response to the signals SIG received from the host 3100. In an embodiment, the signals SIG may be signals based on the interfaces of the host 3100 and the SSD 3200. For example, the signals SIG may be signals defined by at least one of various interfaces such as universal serial bus (USB), multimedia card (MMC), embedded MMC (eMMC), peripheral component interconnection (PCI), PCI-express (PCI-E), advanced technology attachment (ATA), serial-ATA (SATA), parallel-ATA (PATA), small computer small interface (SCSI), enhanced small disk interface (ESDI), integrated drive electronics (IDE), Firewire, universal flash storage (UFS), Wi-Fi, Bluetooth, and nonvolatile memory express (NVMe) interfaces.

The auxiliary power supply 3230 may be coupled to the host 3100 through the power connector 3002. The auxiliary power supply 3230 may be supplied with power PWR from the host 3100 and may be charged. The auxiliary power supply 3230 may supply the power of the SSD 3200 when the supply of power from the host 3100 is not smoothly performed. In an embodiment, the auxiliary power supply 3230 may be positioned inside the SSD 3200 or positioned outside the SSD 3200. For example, the auxiliary power supply 3230 may be disposed in a main board and may supply auxiliary power to the SSD 3200.

The buffer memory 3240 functions as a buffer memory of the SSD 3200. For example, the buffer memory 3240 may temporarily store data received from the host 3100 or data received from the plurality of flash memories 3221 to 322n or may temporarily store metadata (e.g., mapping tables) of the flash memories 3221 to 322n. The buffer memory 3240 may include volatile memories such as DRAM, SDRAM, DDR SDRAM, LPDDR SDRAM, and GRAM or nonvolatile memories such as FRAM, ReRAM, STT-MRAM, and PRAM.

Figure 22:
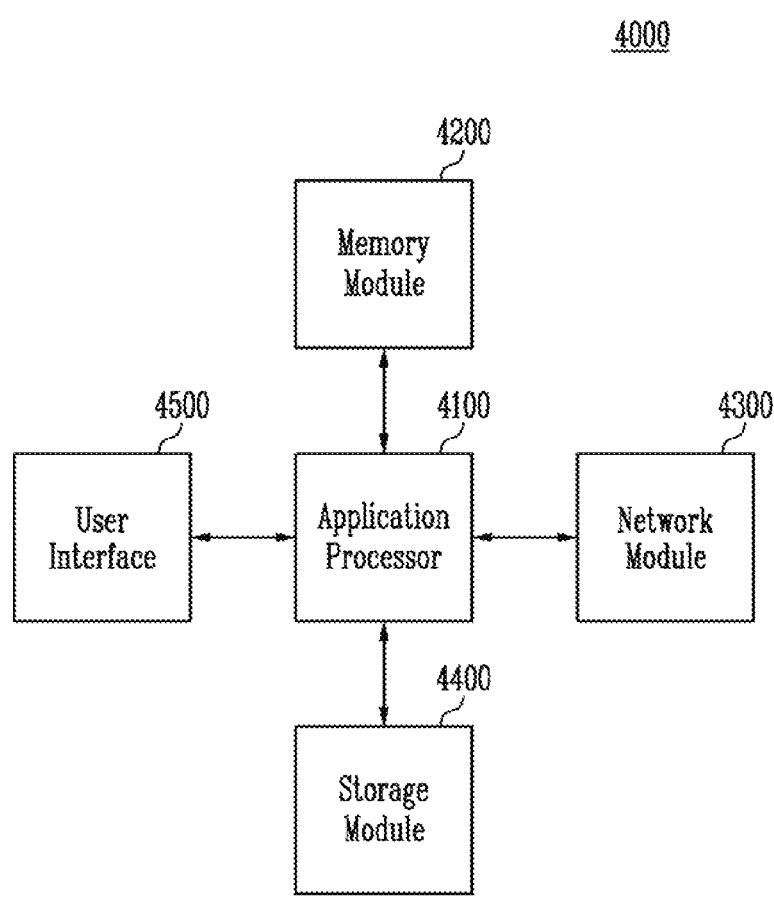
FIG. 22 is a block diagram illustrating a user system to which a storage device according to an embodiment of the present disclosure is applied.

FIG. 22 is a block diagram illustrating a user system to which the storage device according to an embodiment of the present disclosure is applied.

Referring to FIG. 22, a user system 4000 may include an application processor 4100, a memory module 4200, a network module 4300, a storage module 4400, and a user interface 4500.

The application processor 4100 may run components included in the user system 4000, an Operating System (OS) or a user program. In an embodiment, the application processor 4100 may include controllers, interfaces, graphic engines, etc. for controlling the components included in the user system 4000. The application processor 4100 may be provided as a system-on-chip (SoC).

The memory module 4200 may function as a main memory, a working memory, a buffer memory or a cache memory of the user system 4000. The memory module 4200 may include volatile RAMs such as DRAM, SDRAM, DDR SDRAM, DDR2 SDRAM, DDR3 SDRAM, LPDDR SDRAM, LPDDR2 SDRAM, and LPDDR3 SDRAM, or nonvolatile RAMs such as PRAM, ReRAM, MRAM, and FRAM. In an embodiment, the application processor 4100 and the memory module 4200 may be packaged based on package-on-package (POP) and may then be provided as a single semiconductor package.

The network module 4300 may communicate with external devices. For example, the network module 4300 may support wireless communication, such as Code Division Multiple Access (CDMA), Global System for Mobile communication (GSM), wideband CDMA (WCDMA), CDMA-2000, Time Division Multiple Access (TDMA), Long Term Evolution (LTE), WiMAX, WLAN, UWB, Bluetooth, or Wi-Fi communication. In an embodiment, the network module 4300 may be included in the application processor 4100.

The storage module 4400 may store data. For example, the storage module 4400 may store data received from the application processor 4100. Alternatively, the storage module 4400 may transmit the data stored in the storage module 4400 to the application processor 4100. In an embodiment, the storage module 4400 may be implemented as a nonvolatile semiconductor memory device, such as a Phase-change RAM (PRAM), a Magnetic RAM (MRAM), a Resistive RAM (RRAM), a NAND flash memory, a NOR flash memory, or a NAND flash memory having a three-dimensional (3D) structure. In an embodiment, the storage module 4400 may be provided as a removable storage medium (i.e., removable drive), such as a memory card or an external drive of the user system 4000.

In an embodiment, the storage module 4400 may include a plurality of nonvolatile memory devices, each of which may be operated in the same way as the memory device described above with reference to FIG. 1. The storage module 4400 may be operated in the same way as the storage device 50 described above with reference to FIG. 19.

The user interface 4500 may include interfaces which input data or instructions to the application processor 4100 or output data to an external device. In an embodiment, the user interface 4500 may include user input interfaces such as a keyboard, a keypad, a button, a touch panel, a touch screen, a touch pad, a touch ball, a camera, a microphone, a gyroscope sensor, a vibration sensor, and a piezoelectric device. The user interface 4500 may further include user output interfaces such as a Liquid Crystal Display (LCD), an Organic Light Emitting Diode (OLED) display device, an Active Matrix OLED (AMOLED) display device, an LED, a speaker, and a monitor.

A memory device and a method of operating the memory device according to the present disclosure may provide a shortened program operation time.

What is claimed is:

1. A memory device, comprising:
    a plurality of pages coupled to a common word line and configured to be sequentially selected by different select lines;
    a program operation controller configured to perform a program operation on a first page that is to be programmed first, among the plurality of pages; and
    a start loop manager configured to generate start loop information about a program loop in which program verification corresponding to each of a plurality of program states to be formed by threshold voltages of memory cells included in the first page starts during the program operation on the first page,
    wherein the program operation controller is further configured to perform a program operation on a second page to be programmed subsequent to the first page, among the plurality of pages, based on the start loop information.

2. The memory device according to claim 1, wherein the program operation controller is configured to omit program verification corresponding to each of a plurality of program states to be formed by threshold voltages of memory cells included in the second page based on the start loop information, during the program operation on the second page.

3. The memory device according to claim 2, wherein the program verification comprises any one of a pass bit check operation of determining whether a number of memory cells having threshold voltages higher than a verify voltage is greater than a first reference number and a fail bit check operation of determining whether a number of memory cells having threshold voltages lower than the verify voltage is less than a second reference number.

4. The memory device according to claim 3, wherein the start loop manager is configured to generate the start loop information based on a program loop in which a pass bit check operation for each of a plurality of program states to be programmed to the first page has passed.

5. The memory device according to claim 3, wherein the start loop manager is configured to generate start loop information about a program loop in which a fail bit check operation for each of the plurality of program states to be programmed to the first page starts.

6. The memory device according to claim 5, wherein the program operation controller is configured to omit a fail bit verify operation for a plurality of program states to be programmed to the second page based on the start loop information.

7. The memory device according to claim 6, wherein the program operation controller is configured to omit the fail bit verify operation for each of the plurality of program states to be programmed to the second page in a range to a program loop just previous to a program loop in which the fail bit verify operation for each of the plurality of program states to be programmed to the first page starts.

8. The memory device according to claim 3, wherein the program operation controller is configured to perform the fail bit check operation from a program loop subsequent to the program loop in which the pass bit check operation for each of a plurality of program states has passed during the program operation on the first page.

9. The memory device according to claim 3, wherein the program operation controller is configured to perform the fail bit check operation from a program loop after a preset number of program loops have been performed from a program loop in which the pass bit check operation for each of a plurality of program states has passed during the program operation on the first page.

10. The memory device according to claim 1, wherein the program operation controller is configured to sequentially perform a program operation on the plurality of pages by sequentially applying a select voltage to the different select lines.

11. The memory device according to claim 10, wherein the select lines comprise drain select lines or source select lines.

12. A memory device, comprising:
    a first cell string and a second cell string coupled to a common bit line;
    a program operation controller configured to sequentially program a first memory cell coupled to a common word line, among memory cells included in the first cell string, and a second memory cell coupled to the common word line, among memory cells included in the second cell string; and
    a start loop manager configured to generate start loop information about a program loop in which program verification, corresponding to each of a plurality of program states that are capable of being formed by a threshold voltage of the first memory cell, starts during a program operation on the first memory cell,
    wherein a program operation on the second memory cell is performed based on the start loop information.

13. The memory device according to claim 12, wherein the program operation controller is configured to omit program verification, corresponding to each of a plurality of program states that are capable of being formed by a threshold voltage of the second memory cell, based on the start loop information during the program operation on the second page.

14. The memory device according to claim 13, wherein the program verification comprises any one of a pass bit check operation of determining whether a threshold voltage of the corresponding memory cell is higher than a verify voltage, and a fail bit check operation of determining whether the threshold voltage of the corresponding memory cell is lower than the verify voltage.

15. The memory device according to claim 14, wherein the start loop manager is configured to generate the start loop information based on a program loop in which a pass bit check operation for each of a plurality of program states that are capable of being formed by the threshold voltage of the first memory cell has passed.

16. A method of operating a memory device, wherein the memory device includes a plurality of pages coupled to a common word line and configured to be sequentially selected by different select lines, the plurality of pages each having a plurality of memory cells, the method comprising:
during a program operation on a first page to be programmed first, among the plurality of pages, generating start loop information about a program loop in which program verification for pages to be subsequently programmed starts, based on a program loop in which program verification for each of a plurality of program states has passed; and
programming a second page to be programmed subsequent to the first page, among the plurality of pages, based on the start loop information.

17. The method according to claim 16, wherein generating the start loop information comprises generating the start loop information about a start program loop in which a fail bit check operation on pages to be subsequently programmed starts, based on a program loop in which a pass bit check operation for each of the plurality of program states has passed.

18. The method of claim 17, wherein:
the pass bit check operation comprises determining whether a number of memory cells having threshold voltages higher than a verify voltage is greater than a first reference number; and
the fail bit check operation comprises determining whether a number of memory cells having threshold voltages lower than the verify voltage is less than a second reference number.

19. The method according to claim 18, wherein programming the second page comprises performing program verification by performing the fail bit check operation from the start program loop.

20. The method according to claim 16, wherein the select lines are drain select lines or source select lines.

* * * * *